(12) United States Patent
Ahmed et al.

(10) Patent No.: US 8,442,161 B2
(45) Date of Patent: May 14, 2013

(54) ESTIMATION OF SAMPLE CLOCK FREQUENCY OFFSET USING ERROR VECTOR MAGNITUDE

(75) Inventors: I. Zakir Ahmed, Bangalore (IN);
Krishna Bharadwaj, Bangalore (IN);
Ramesh Krishnan, Bangalore (IN);
Vijaya Yajnanarayana, Bangalore (IN)

(73) Assignee: National Instruments Corporation, Austin, TX (US)

( * ) Notice: Subject to any disclaimer, the term of this patent is extended or adjusted under 35 U.S.C. 154(b) by 187 days.

(21) Appl. No.: 13/027,885

(22) Filed: Feb. 15, 2011

(65) Prior Publication Data
US 2012/0207248 A1 Aug. 16, 2012

(51) Int. Cl.
*H04L 27/06* (2006.01)
(52) U.S. Cl.
USPC ............................................. 375/340; 370/471
(58) Field of Classification Search .... 375/340; 370/471
See application file for complete search history.

(56) References Cited

PUBLICATIONS

Daniel R. Jeske, "On Maximum-Likelihood Estimation of Clock Offset," IEEE Transactions on Communications, vol. 53, No. 1, Jan. 2005, pp. 53-54.

Rishad Ahmed Shafik, et al., "On the Error Vector Magnitude As a Performance Metric and Comparative Analysis," 2nd International Conference on Emerging Technologies (IEEE—ICET 2006), Nov. 13-14, 2006, pp. 27-31.
Michael D. McKinley, et al., "EVM Calculation for Broadband Modulated Signals," 64th ARFTG Conf. Dig., Dec. 2004, pp. 45-52.
Agilent PN 89400-14: Using Error Vector Magnitude Measurements to Analyze and Troubleshoot Vector-Modulated Signals—Product Note, Agilent Technologies: Innovating the HP Way, copyright 1997, 2000, 14 pages.
Carrier Recovery, NI Developer Zone—National Instruments, Nov. 7, 2006; http://zone.ni.com/devzone/cda/tut/p/id/5523, 5 pages. [Retrieved Jan. 4, 2011].

*Primary Examiner* — Shuwang Liu
*Assistant Examiner* — Michael Neff
(74) *Attorney, Agent, or Firm* — Meyertons Hood Kivlin Kowert & Goetzel, P.C.; Jeffrey C. Hood; Mark K. Brightwell

(57) ABSTRACT

A low complexity system and method for operating a receiver in order to estimate an offset between the actual sample clock rate $1/T_S'$ of a receiver and an intended sample clock rate $1/T_S$. The receiver captures samples of a received baseband signal at the rate $1/T_S'$, operates on the captured samples to generate an estimate for the clock rate offset, and fractionally resamples the captured samples using the clock rate offset. The resampled data represents an estimate of baseband symbols transmitted by the transmitter. The action of operating on the captured samples involves computing an error vector signal and then estimating the clock rate offset using the error vector signal. The error vector signal may be computed in different ways depending on whether or not carrier frequency offset and carrier phase offset are assumed to be present in the received baseband signal.

20 Claims, 11 Drawing Sheets

| | |
|---|---|
| Sample Clock Rate (1/$T_S$) of the "Transmitter" | 3.84 MHz |
| Burst Length (Symbols) | 4096 |
| Oversampling Factor | 1 |
| Modulation Type | 64QAM |
| Carrier Frequency Offset | 1 kHz |
| Carrier Phase Offset | 25 degrees |

FIG. 5

| Sample Clock Offset Introduced (Hz) | Estimated Clock Offset using Proposed Algorithm |
|---|---|
| -5 | -5.07 |
| -4 | -4.017 |
| -3 | -3.164 |
| -2 | -2.076 |
| -1 | -1.046 |
| 0 | 0 |
| 1 | 0.983 |
| 2 | 2.063 |
| 3 | 3.126 |
| 4 | 4.032 |
| 5 | 5.101 |

FIG. 6

ESTIMATION OF SAMPLE CLOCK FREQUENCY OFFSET USING ERROR VECTOR MAGNITUDE

BACKGROUND OF THE INVENTION

1. Field of the Invention

The present invention relates to the field of digital signal processing, and more specifically, to systems and methods for estimating the offset between the actual sample-clock-frequency used by a receiver's analog-to-digital converter and an intended sample-clock-frequency.

2. Description of the Related Art

At a transmitter, a stream of information bits is mapped into a stream of complex symbols $\{U_n\}$ in a constellation (i.e., a set of points in the complex plane), e.g., a QAM constellation. The stream of symbols $\{U_n\}$ may be supplied to a subsystem that converts the symbol stream into an analog baseband signal u(t). The analog baseband signal u(t) may be used to modulate a carrier signal. The modulated carrier is transmitted through a channel, e.g., a wired channel such as a cable, a wireless channel such as the atmosphere or free space, a fiber optic channel, etc. A receiver captures a channel-distorted version of the transmitted signal from the channel, recovers a baseband signal from the captured signal, and samples the baseband signal. However, the sampling clock rate $1/T_S'$ used by the receiver is in general different from an intended sampling clock rate $1/T_S$. This offset between the intended clock rate $1/T_S$ and the actual clock rate $1/T_S'$ makes it difficult to accurately demodulate the received baseband signal. Thus, there exists a need for methods, especially low-complexity methods, for estimating this clock rate offset.

SUMMARY

A method for operating a receiver system according to the present invention may involve the following operations.

The method involves an analog-to-digital converter (ADC) of the receiver system capturing samples $\{x(nT_S')\}$ of a received baseband signal, where n is a sample index, where $T_S'$ is a period of the sample clock of the ADC. The period $T_S'$ is not known at least initially. However, it may be estimated as one of the possible results of the present method.

The method also involves a processor of the receiver system computing a reference signal $\{r(n)\}$ by performing carrier-frequency-offset (CFO) removal and carrier-phase-offset (CPO) removal on the baseband signal samples $\{x(nT_S')\}$ to obtain corrected samples; by performing hard decision demodulation on the corrected samples to obtain a bit stream; and by re-modulating the bit stream to determine the reference signal.

The method also involves the processor computing an intermediate signal $\{Y(n)\}$ by operating on the baseband signal samples $\{x(nT_S')\}$ to remove CFO and CPO using the reference signal $\{r(n)\}$.

The method also involves the processor computing an error vector signal $\{e(n)\}$ based on the intermediate signal $\{Y(n)\}$ and the reference signal $\{r(n)\}$, e.g., according to the relation: e(n)=Y(n)−r(n).

The method also involves the processor computing an estimate Q for the absolute value |ϵ| of an offset parameter ϵ based on an average slope of an absolute value of the error vector signal $\{e(n)\}$. The offset parameter ϵ represents a relative offset between the period $T_S'$ and an intended period $T_S$ of the ADC's sample clock.

The method also involves the processor fractionally resampling the baseband signal samples $\{x(nT_S')\}$ by a factor (1+Q) to obtain a first set of adjusted samples $\{Z_1(n)\}$ corresponding to the sample rate $f_1=(1+Q)/T_S'$, and fractionally resampling the baseband signal samples $\{x(nT_S')\}$ by the factor (1−Q) to obtain a second set of adjusted samples $\{Z_2(n)\}$ corresponding to the sample rate $f_2=(1-Q)/T_S'$.

The method also involves the processor computing a first error vector signal $\{e_1(n)\}$ based on the first set of adjusted samples $\{Z_1(n)\}$ and the reference signal $\{r(n)\}$, e.g., according to the expression: $e_1(n)=Z_1(n)-r(n)$.

The method also involves the processor computing a second error vector signal $\{e_2(n)\}$ based on the second set of adjusted samples $\{Z_2(n)\}$ and the reference signal $\{r(n)\}$, e.g., according to the expression: $e_2(n)=Z_2(n)-r(n)$.

The method also involves computing an RMS value $R_1$ of the first error vector signal $\{e_1(n)\}$, and computing an RMS value $R_2$ of the second error vector signal $\{e_2(n)\}$.

The method also involves selecting either Q or −Q as an estimate for the offset parameter ϵ based on whether or not $R_1$ is smaller than $R_2$. The estimated value of ϵ may be used in any of a variety of ways. For example, it may be used to resample to received signal samples to the intended sample rate, to adjust the frequency of the ADC's sample clock, to compute an estimate for the period $T_S'$, etc.

Another method for operating a receiver system may involve the following operations.

The method involves an analog-to-digital converter (ADC) of the receiver system capturing samples $\{x(nT_S')\}$ of a received baseband signal, where n is a sample index, where $T_S'$ is a period of a sample clock of the ADC. The period $T_S'$ is not known at least initially. However, it may be estimated as one of the possible results of the present method.

The method also involves a processor of the receiver system computing a reference signal $\{r(n)\}$ by performing carrier-frequency-offset (CFO) removal and carrier-phase-offset (CPO) removal on the baseband signal samples $\{x(nT_S')\}$ to obtain corrected samples; by performing hard decision demodulation on the corrected samples to obtain a bit stream; and by re-modulating the bit stream to determine the reference signal.

The method also involves the processor computing an intermediate signal $\{Y(n)\}$ by operating on the baseband signal samples $\{x(nT_S')\}$ to remove the CFO and the CPO using the reference signal $\{r(n)\}$.

The method also involves the processor computing a differential of the reference signal $\{r(n)\}$ and a differential of the intermediate signal $\{Y(n)\}$.

The method also involves the processor computing an error vector signal $\{e'(n)\}$ based on the differential of the intermediate signal $\{Y(n)\}$ and the differential of the reference signal $\{r(n)\}$.

The method also involves the processor computing an estimate Q for the absolute value |ϵ| of an offset parameter ϵ based on an RMS value of the error vector signal $\{e'(n)\}$. The offset parameter ϵ represents a relative offset between the period $T_S'$ and an intended period $T_S$ of the sample clock of the ADC.

The method also involves the processor fractionally resampling the baseband signal samples $\{x(nT_S')\}$ by a factor of (1+Q) to obtain a first set of adjusted samples $\{Z_1(n)\}$ corresponding to sample rate $f_1=(1+Q)/T_S'$, and fractionally resampling the baseband signal samples $\{x(nT_S')\}$ by a factor of (1−Q) to obtain a second set of adjusted samples $\{Z_2(n)\}$ corresponding to sample rate $f_2=(1-Q)/T_S'$.

The method also involves the processor computing a first error vector signal $\{e_1(n)\}$ based on the first set of adjusted samples $\{Z_1(n)\}$ and the reference signal $\{r(n)\}$, and computing a second error vector signal $\{e_2(n)\}$ based on the second set of adjusted samples $\{Z_2(n)\}$ and the reference signal $\{r(n)\}$.

The method also involves the processor selecting either Q or −Q as an estimate for the offset parameter $\epsilon$, where the selection of either Q or −Q is based on whether or not an RMS value $R_1$ of the first error vector signal is smaller than an RMS value $R_2$ of the second error vector signal. The estimated value of $\epsilon$ may be used in any of a variety of ways. For example, it may be used to resample to received signal samples to the intended sample rate $1/T_S$, to make corrective adjustments to the frequency of the ADC's sample clock, to compute an estimate for the sample period $T_S'$, etc.

BRIEF DESCRIPTION OF THE DRAWINGS

A better understanding of the present invention can be obtained when the following detailed description of the preferred embodiment is considered in conjunction with the following drawings.

FIG. 5 is a table showing one configuration that was used for simulation within the framework of FIG. 4.

FIG. 6 is a table showing the clock frequency offset ($f_S'-f_S$) introduced by simulation, and the corresponding estimated value of the clock frequency offset.

Figure 1:
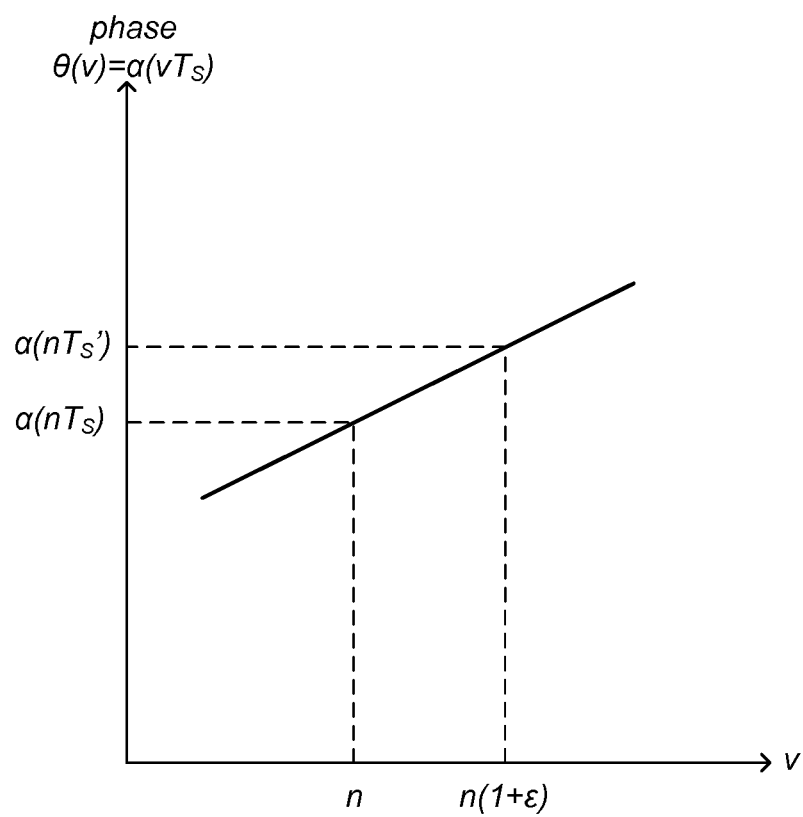
FIG. 1 illustrates the linearity of the phase $\alpha(t)$ between sampling time $nT_S$ and sampling time $nT_S' = (1+\epsilon)nT_S$.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (e.g., having the potential to, being able to), not a mandatory sense (e.g., must).

DETAILED DESCRIPTION OF THE PREFERRED EMBODIMENTS

In the following description, numerous specific details are set forth to provide a thorough understanding of embodiments of the present invention. However, one having ordinary skill in the art should recognize that the invention may be practiced with various modifications to these specific details.

Terminology

The following is a glossary of terms used in the present document.

Memory Medium—A memory medium is a medium configured for the storage and retrieval of information. Examples of memory media include: various kinds of semiconductor memory such as RAM and ROM; various kinds of magnetic media such as magnetic disk, tape, strip and film; various kinds of optical media such as CD-ROM and DVD-ROM; various media based on the storage of electrical charge and/or other physical quantities; media fabricated using various lithographic techniques; etc. The term "memory medium" may also include a set of two or more memory media which reside at different locations, e.g., at different computers that are connected over a network.

Programmable Hardware Element—a hardware device that includes multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. As used herein, the term "program" includes within its scope of meaning: 1) a software program which is stored in a memory and is executable by a processor, or, 2) a hardware configuration program useable for configuring a programmable hardware element. Any of the method embodiments described herein, or, any combination of the method embodiments described herein, or, any subset of any of the method embodiments described herein, or, any combination of such subsets may be implemented in terms of one or more programs.

Software Program—the term "software program" is intended to have the full breadth of its ordinary meaning, and includes any type of program instructions, code, script and/or data, or combinations thereof, that may be stored in a memory medium and executed by a processor or computer system. Exemplary software programs include: programs written in text-based programming languages such as C, C++, Java™, Pascal, Fortran, Perl, etc.; graphical programs (programs written in graphical programming languages); assembly language programs; programs that have been compiled to machine language; scripts; and other types of executable software. A software program may comprise two or more subprograms that interoperate in a specified manner.

Hardware Configuration Program—a program, e.g., a netlist or bit file, that can be used to program or configure a programmable hardware element.

Graphical Program—A program comprising a plurality of interconnected nodes or icons, where the plurality of interconnected nodes or icons visually indicate the functionality of the program. A graphical program is a type of diagram.

The following provides examples of various aspects of graphical programs. The following examples and discussion are not intended to limit the above definition of graphical program, but rather provide examples of what the term "graphical program" encompasses.

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others.

The term "graphical program" includes models or block diagrams created in graphical modeling environments, where the model or block diagram comprises interconnected nodes or icons that visually indicate operation of the model or block diagram; exemplary graphical modeling environments include Simulink, SystemBuild, VisSim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as a receiver (e.g., an RF receiver) or a receiver front end, a signal processing board, a modem, a network interface (e.g., a wireless network interface), a unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Data Flow Graphical Program (or Data Flow Diagram)—A graphical program or diagram comprising a plurality of interconnected nodes, where the connections between the nodes indicate that data produced by one node is used by another node.

Node—In the context of a graphical program, an element that may be included in a graphical program. A node may have an associated icon that represents the node in the graphical program, as well as underlying code and/or data that implements functionality of the node. Exemplary nodes include function nodes, sub-program nodes (sub-VIs), terminal nodes, structure nodes, etc. Nodes may be connected together in a graphical program by connection icons or wires.

Graphical User Interface—this term is intended to have the full breadth of its ordinary meaning. The term "Graphical User Interface" is often abbreviated to "GUI". A GUI may include one or more input GUI elements, one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses.

A GUI may comprise a single window having one or more GUI elements, or may comprise more than one window, each having one or more GUI Elements.

A GUI may be associated with a diagram, e.g., a graphical program. In this instance, various mechanisms may be used to connect GUI elements in the GUI with nodes or icons in the diagram/graphical program. For example, when Input Controls and Output Indicators are created in the GUI, corresponding nodes (e.g., terminals) may be automatically created in the diagram or graphical program. Alternatively, the user can place terminal nodes in the diagram which may cause the display of corresponding GUI elements front panel objects in the GUI, either at edit time or later at run time. As another example, the GUI may comprise GUI Elements embedded in the block diagram portion of the graphical program.

Front Panel—A Graphical User Interface that includes input controls and output indicators, and that enables a user to interactively control or manipulate the input being provided to a program or diagram, and view output of the program or diagram, during execution.

A front panel is a type of GUI. A front panel may be associated with a diagram or graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input, and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, switches, text input boxes, numeric input fields, etc.

Output Indicator—a graphical user interface element for displaying output from a program. Exemplary output indicators include charts, graphs, gauges, text output boxes, numeric displays, etc. An output indicator is sometimes referred to as an "output control".

Computer System—any of various types of computing or processing systems, including a personal computer (PC), a mainframe computer system, a workstation, a laptop, a network appliance, an Internet appliance, a hand-held or mobile device, a personal digital assistant (PDA), a television system, a grid computing system, or other device or combinations of devices. In general, the term "computer system" can be broadly defined to encompass any device (or combination of devices) having at least one processor that is configured to execute instructions that are stored on a memory medium.

Measurement Device—includes instruments, data acquisition devices, smart sensors and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card, a video capture board, a smart camera, a motion control device, a robot having machine vision, and other similar types of devices. Exemplary "stand-alone" instruments include oscilloscopes, multimeters, signal analyzers, signal demodulators, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, e.g., may receive and analyze data, and issue automation control signals in response.

Embodiments of the present inventions may be realized in any of various forms. For example, any of the present inventions may be realized as a computer-implemented method, a computer-readable memory medium, or a computer system. Furthermore, any of the present inventions may be realized using one or more custom-designed hardware devices such as ASICs.

A computer-readable memory medium is a memory medium that stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may include a processor (or a set of interconnected processors) and a memory medium. The memory medium stores program instructions. The processor is configured to read and execute the program instructions from the memory medium. The program instructions are executable by the processor to implement a method, e.g., any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a handheld device, a mobile device, a tablet computer, a wearable computer, a computer integrated in a head-mounted display, etc.

In some embodiments, a set of two or more computers distributed across a computer network may be configured to partition the effort of executing a computational method, e.g., any of the various method embodiments described herein (or, any combination of the method embodiments described herein, or, any subset of any of the method embodiments described herein, or, any combination of such subsets).

In some embodiments, a first computer may be configured to receive a modulated signal, down-convert the modulated signal to baseband, and capture samples of the baseband signal. The first computer may send the captured samples to a second computer through the computer network. The second computer may operate on the signal samples according to any of the method embodiments described herein, or, any combination of the method embodiments described herein, or, any subset of any of the method embodiments described herein, or, any combination of such subsets.

The following is a list of acronyms used herein.

| | |
|---|---|
| BER | Bit Error Rate |
| CFO | Carrier Frequency offset |
| CPO | Carrier phase offset |
| EVM | Error Vector Magnitude |
| FPGA | Field Programmable Gate Array |

-continued

| | |
|---|---|
| PLL | Phase-Locked Loop |
| QAM | Quadrature Amplitude Modulation |

Clock frequency offset is the difference between the clock frequency $f_S$ of the digital-to-analog converter (DAC) at the transmitter and the clock frequency $f_S'$ of the analog-to-digital converter (ADC) at the receiver. Similarly, clock period offset is the difference between the clock period $T_S$ of the transmitter's DAC and the clock period $T_S'$ of the receiver's ADC. Relative clock period offsets is defined as $$\varepsilon = \frac{T_S' - T_S}{T_S}. \tag{1}$$

This patent describes among other things methods for estimating the parameter $\varepsilon$.

Under the assumption that the transmitter's sample clock conforms ideally to an intended value of the period $T_S$, e.g., a value specified by (or derived from) a communication protocol, the parameter $\varepsilon$ may be interpreted as a measure of the departure of the period $T_S'$ from the intended period value.

In some embodiments, the receiver may use the estimated value of the parameter $\varepsilon$ to resample the samples captured by the ADC, i.e., to resample the captured samples to the intended sample rate $1/T_S$.

In some embodiments, the receiver may use the estimated value of the parameter $\varepsilon$ to adjust the clock frequency $f_S'$ of the ADC in order to drive the clock frequency $f_S'$ towards the intended clock frequency $1/T_S$.

In some embodiments, the receiver may compute an estimate for the period $T_S'$ based on the estimated value of the parameter $\varepsilon$ and the intended period value $T_S$. The computed value of the period $T_S'$ may be reported/displayed to a user, e.g., via a graphical user interface.

Because of the offset between the actual ADC clock frequency $f_S'$ and the intended clock frequency $f_S$, the receiver's task of demodulating the received baseband signal is challenging and prone to large BERs. In applications involving the test and measurement of devices such as radio transceivers (e.g. mobile phones), a transmitter generates a baseband signal, and transmits the baseband signal. A signal analyzer receives a noise-perturbed version of the transmitted baseband signal, and analyzes the received baseband signal, e.g., to evaluate the performance of the transmitter. Error vector magnitude (EVM) is a widely used metric to evaluate the modulation quality of the transmitter.

In the presence of a clock frequency offset, one of the requirements of the measurement application is to estimate the clock frequency offset, or equivalently, the relative clock offset $\varepsilon$. This problem becomes much more complex in the presence of carrier frequency offset and carrier phase offset. Carrier frequency offset is the difference between the frequency of the receiver's carrier signal and the frequency of the transmitter's carrier signal. Similarly, carrier phase offset is the difference between the phase of the receiver's carrier signal and the phase of the transmitter's carrier signal.

Signal Model

At the transmitter, a stream of information bits $\{b_k\}$ is mapped into a stream of complex symbols $\{U_n\}$ in a constellation (i.e., a set of points in the complex plane), e.g., a QAM constellation. The stream of symbols $\{U_n\}$ are used to generate a stream of samples. (The number of samples per symbol is referred to as the SPS factor.) The samples are supplied to a subsystem that converts the samples into an analog baseband signal u(t) based on a conversion clock. The analog baseband signal u(t) may be used to modulate a carrier signal (or an orthogonal pair of carrier signals). The modulated carrier is transmitted through a channel, e.g., a wired channel such as a cable, a wireless channel such as the atmosphere or free space, a fiber optic channel, etc. A receiver captures a channel-distorted version of the transmitted signal from the channel, recovers a baseband signal from the captured signal, and samples the baseband signal. However, the sampling clock rate $1/T_S'$ used by the receiver is in general different from an intended sampling clock rate $1/T_S$.

Let $X(t)=A(t)\exp(j\alpha(t))$ denote the received baseband signal, where $A(t)$ is the instantaneous amplitude and $\alpha(t)$ is the instantaneous phase. Thus, the samples $\{X(nT_S')\}$ captured by the receiver's ADC may be represented as:

$$X(nT_S')=A(nT_S')\exp(j\alpha(nT_S')). \quad (2)$$

Ideally, the clock period $T_S'$ would equal the intended period $T_S$, and the receiver's symbol-timing recovery would be perfect. In this case, the received samples would be:

$$X(nT_S)=A(nT_S)\exp(j\alpha(nT_S)). \quad (3)$$

With appropriate normalization of signal power, the samples $\{X(nT_S)\}$ might be taken as (or used to determine) estimates of the transmitted symbols $\{U_n\}$. In general, however, the clock period $T_S'$ is not equal to intended clock period $T_S$. Thus, the receiver may operate on the received samples $\{X(nT_S')\}$ in order to estimate the relative clock period offset $\epsilon$. The estimated value of $\epsilon$ (or a graphical representation thereof) may be displayed to a user of the receiver. Furthermore, the receiver may compute an estimate of the clock period $T_S'$ based on the estimated value of $\epsilon$ and the intended period value $T_S$.

In some embodiments, the estimated value of $\epsilon$ may be used to fractionally resample the received samples in order to obtain corrected samples that correspond to the intended clock frequency $1/T_S$. In one alternative embodiment, the receiver may use the estimated value of $\epsilon$ to adjust the sampling clock frequency $f_S'=1/T_S'$ of the receiver's ADC. The adjustment causes the sampling clock frequency $f_S'$ to converge towards the transmitter's conversion clock frequency $f_S=1/T_S$.

Expression (2) for the received samples assumes that there is no carrier frequency offset and no carrier phase offset in the receiver, i.e., that the receiver's carrier frequency and phase exactly match the transmitter's carrier frequency and phase, respectively. A more general expression for the received samples (after symbol timing recovery), admitting the possibility of both carrier frequency offset and carrier phase offset, looks like:

$$X(nT_S')=A(nT_S')\exp\{j\alpha(nT_S')+\theta_0+\Delta\omega_0 nT_S')\}, \quad (4)$$

where $\Delta\omega_o$ is the carrier frequency offset in radians per sample, and $\theta_0$ is the angle error corresponding to the carrier phase offset.

From expression (1), it follows that $T_S'=(1+\epsilon)T_S$. Thus, expression (4) may be equivalently written as:

$$X((1+\epsilon)nT_S)=A((1+\epsilon)nT_S)\exp(j\phi(n)), \quad (5A)$$

$$\phi(n)=\alpha((1+\epsilon)nT_S)+\theta_0+\Delta\omega_0(1+\epsilon)nT_S. \quad (5B)$$

Algorithm for Estimating Relative Clock Period Offset

An error vector signal $e(n)$ is computed as the difference between an intermediate signal $Y(n)$ and a reference signal $r(n)$:

$$e(n)=Y(n)-r(n). \quad (6)$$

(The quantity $e(n)$ is a complex number, or equivalently, a vector in the complex plane. Thus, the term "vector" is used to describe $e(n)$, and the signal $\{e(n)\}$ is said to be a "vector signal".)

The reference signal $r(n)$ represents an initial estimate for the ideal samples $\{X(nT_S)\}$. (The receiver may use the reference signal $r(n)$ and the intermediate signal $Y(n)$ to determine an improved estimate for the ideal samples as described hereinafter. The computation of the error vector signal $e(n)$ is a step in that determination.) In other words, $$r(n)\approx X(nT_S)=A(nT_S)\exp(j\alpha(nT_S)). \quad (7)$$

(Note that the relative clock offset $\epsilon$ is not present in the reference signal $r(n)$, having been eliminated by the hard decision demodulation.)

The samples $\{r(n)\}$ of the reference signal may be computed from the received samples $\{X(nT_S')\}$ as follows. First, methods for removing carrier frequency offset (CFO) and carrier phase offset (CPO) are applied to the received samples $\{X(nT)\}$ to obtain corrected samples. Those methods may rely on a preamble (or a set of pilot symbols) that has been embedded in the transmitted signal by the transmitter. Such methods are well known to those of ordinary skill in the art of signal processing. For more information on the methods for removing CFO and CPO, please see the following references: (a) U. Mengali and A. N. D'Andrea, "Synchronization Techniques for Digital Receivers", New York, Plenum, 1997; (b) "WCDMA for UMTS", edited by H. Holma and A. Toskala, Wiley, New York, 2003; and (c) M. Luise and R. Reggiannini, "Carrier Frequency Recovery in All-Digital Modems for Burst-Mode Transmissions," IEEE Transactions on Communications, Vol. 43, No. 234, pages 1169-1178, February-April 1995.

After removal of the CFO and CPO, the corrected samples may be subjected to hard decision demodulation in order to obtain a sequence of bit values. The sequence of bit values resulting from the hard decision demodulation may then be re-modulated to obtain the samples $\{r(n)\}$ of the reference signal. The process of hard decision demodulation is well known to those of ordinary skill in the art of signal processing. For more information on hard decision demodulation, please see either of the following references: (1) "Using Error Vector Magnitude Measurement to Analyze and Troubleshoot Vector Modulate Signals", Agilent Product Note 89400-14, Agilent Technologies Literature No. 5965-2898E, 2000; (2) Voelker, Kenneth M. "Apply Error Vector Measurements in Communications Design", Microwaves & RF, December 1995, pp. 143-152.

The constellation of the reference signal $\{r(n)\}$ is scaled to the average power of the received signal $\{X(nT_S')\}$.

As shown in expression (6) above, the computation of the error vector signal $e(n)$ also involves the intermediate signal $Y(n)$. The samples $\{Y(n)\}$ of the intermediate signal are computed from the received samples $\{X(nT)\}$ by removing the CFO and CPO with the help of the reference signal. In one embodiment, an estimate for the carrier frequency offset $\Delta\omega_0$ may be determined by computing the average slope over N samples of the sequence $\{\arg(X(nT_S')r(n)^*)\}$, and, an estimate for the carrier phase offset $\theta_0$ may be determined by computing a phase intercept for the same sequence (interpreted as a function of index n). The notation $\arg(z)$ represents the phase (angle) of the complex number z. The superscript "*" denotes complex conjugation.

The samples $\{Y(n)\}$ may be represented by the expression:

$$Y(n)=A(nT_S')\exp(j\alpha(nT_S')). \quad (8)$$

Expression (8) assumes that there is no CFO or CPO in the intermediate signal Y(n). However, because of the sample clock offset $\epsilon$, the CFO removal algorithm and the CPO removal algorithm may fail to completely remove the CFO and CPO from the received samples. As a result there may be some small residual CFO and residual CPO in the intermediate signal Y(n). In this case the intermediate signal Y(n) would have the form:

$$Y(n)=A(nT_S')\exp\{j(\alpha(nT_S')+\Delta\theta+\Delta\omega_0'nT_S')\}, \quad (9)$$

where $\Delta\omega_0'$ is the residual CFO, and $\Delta\theta$ is the residual CPO.

In the discussion below, an expression for the absolute value |e(n)| of the error vector e(n) will be developed based on the intermediate signal Y(n) as given by equation (8). (The absolute value |z| of any complex number z=a+ib is defined as $|z|=\sqrt{a^2+b^2}$.) Furthermore, an expression for the absolute value |e'(n)| of a differential error vector e'(n) will be developed based on the intermediate signal Y(n) as given by expression (9). In each case, a formula will be established for the relative clock offset $\epsilon$ in terms of the corresponding absolute value data. Either of those formulas may be used to estimate $\epsilon$. (The first formula, based on the absolute value |e(n)|, may be used, e.g., in situations where the residual CFO and the residual CPO are believed to be negligibly small. Otherwise, the latter formula, based on the absolute value |e'(n)|, may be used.) The estimated value of $\epsilon$ may then be used to fractionally resample the received samples $\{X(nT_S')\}$ in order to arrive at a more perfect approximation of the ideal samples $\{X(nT_S)\}$, and thus, of the transmitted symbol sequence.

Case-I: Assuming that the intermediate signal Y(n) has no CFO or CPO, the error vector e(n) may be written as:

$$e(n)=A(nT_S')\exp(j\alpha(nT_S'))-A(nT_S)\exp(j\alpha(nT_S)). \quad (10)$$

This expression (10) may be simplified, by making the following assumptions:

(A1) $A(nT_S')=A(nT_S)$ for all n. This assumption is made because the difference between $A(nT_S)$ and $A(nT_S')$ is a significantly smaller contributor to error vector e(n) than is the difference between $\alpha(nT_S)$ and $\alpha(nT_S')$.

(A2) The phase $\alpha(t)$ is assumed to be linear between any intended sampling time $nT_S$ and the corresponding actual sampling time $nT_S'=(1+\epsilon)nT_S$. This linearity is illustrated in FIG. 1.

(A3) The accumulated error in clock phase is low enough not to cause a significant number of hard decision errors over the range of the received sample set.

Employing these assumptions, expression (10) may be rewritten as:

$$e(n) = 2A(nT_S)\sin\left(\frac{\beta(n)}{2}\right)\exp\left\{j\left(\alpha(nT_S)+\frac{\beta(n)}{2}+\frac{\pi}{2}\right)\right\}, \quad (11)$$

where $\beta(n)=\alpha(nT_S')-\alpha(nT_S)$. The absolute value of the error vector e(n) may be normalized to ensure that |e(n)| is in the range (0,1], e.g., by dividing equation (11) by |2A(nTs)|. The normalized absolute value of the error vector e(n) is then given by:

$$|e(n)| = \left|\sin\left(\frac{\beta(n)}{2}\right)\right|. \quad (12)$$

It can be shown that $\beta(n) \approx K\epsilon n$, where K is the slope of the phase function $\theta(v)$ between v=n and v=(1+$\epsilon$)n, where the phase function $\theta(v)$ is defined by the relation:

$$\theta(v)=\alpha(vT_S).$$

The value of slope K may be empirically estimated as discussed below. Thus, the expression (12) can be re-written as:

$$|e(n)| = \left|\sin\left(\frac{K\epsilon n}{2}\right)\right|. \quad (13)$$

When $|\epsilon|$ is small, expression (13) may be approximated by:

$$|e(n)| = \frac{|K\epsilon|n}{2}, \quad (14)$$

assuming the symbol index n is non-negative.

Observe that the absolute value function |e(n)| is linear in the sample index n, with slope given by:

$$\mathrm{grad}(|e(n)|)=|K\epsilon|/2,$$

where "grad" denotes the first-order derivative with respective to index n. Thus, the absolute value of the sample clock offset $\epsilon$ is given by:

$$|\epsilon| = \frac{2}{|K|}\mathrm{grad}(|e(n)|). \quad (15)$$

The slope grad(|e(n)|) may be computed using any of a variety of numerical differentiation formulas. For example, in one embodiment, the slope is computed based on the expression:

$$\mathrm{grade}(|e(n)|)=|e(n)|-|e(n-1)|. \quad (16)$$

Expression (15) may be used by the receiver to compute an estimate for $|\epsilon|$. However, to average out the affect of noise in the received signal samples, the value $|\epsilon|$ may be computed using an average value of the slope grad(|e(n)|):

$$|\epsilon| = \frac{2}{|K|}AVG\{\mathrm{grad}(|e(n)|)\}. \quad (17)$$

In one embodiment, the average slope may be computed based on the expression $$AVG\{\mathrm{grad}(|e(n)|)\} = \frac{\sum_{n=1}^{N-1}(|e(n)|-|e(n-1)|)}{N-1}, \quad (18)$$

where N is the number of samples $\{X(nT_S')\}$ in the received sample set. Other methods for calculating the average slope are contemplated. For example, in one alternative embodiment, the average slope is computed based on a least squares fit of a line having the form y=mx to the data set $$\{(n,\mathrm{grad}(|e(n)|)): n=0, 1, \ldots, N-1\}.$$

To use expression (17) as a means for estimating $|\epsilon|$, the receiver needs to have an estimate for the constant K. The value of constant K is dependent on the sampling period $T_S'$ and can be derived as part of a calibration procedure prior to operating on the received samples. The calibration procedure involves a stored set of baseband signal samples {S(nTs')}. The samples {S(nTs')} have been captured with a known value of clock period Ts', and stored into the memory of the receiver along with the known value of the clock period Ts'. In one embodiment, the samples {S(nTs')} may be captured in a factory using highly accurate equipment to measure the actual period Ts' (or actual clock frequency 1/Ts') used by the receiver's ADC while it is capturing the samples {S(nTs')}. The samples {S(nTs')}, the known value of the clock period Ts' and the intended period value $T_S$ may be stored in the memory of the receiver, e.g., prior to shipping the receiver to a user/customer.

At calibration time, the receiver may access the samples {S(nTs')} from memory and perform the above-described computation of the function grad(|e(n)|) based on the samples {S(nTs')}. Furthermore, the receiver may access the intended period value Ts and the known period value Ts' from the memory, and compute the parameter $\epsilon_0$ according to the relation $$\varepsilon_0 = \frac{T_s' - T_s}{T_s}.$$

Finally, the receiver may estimate the absolute value of the constant K based on the relation:

$$|K| = \frac{2AVG\{grad(|e(n)|)\}}{|\varepsilon_0|}. \quad (19)$$

Case-II: Assuming that the intermediate signal Y(n) has both residual CFO and residual CPO, the error vector e(n) may be written as:

$$e(n)=Y(n)-r(n) \quad (20A)$$

$$e(n)=A(nT_S')\exp\{j(\alpha(nT_S')+\Delta\theta+\Delta\omega_0'nT_S')\}$$

$$-A(nT_S)\exp\{j\alpha(nT_S)\}. \quad (20B)$$

Observe that this expression involves three unknowns: $T_S'$, $\Delta\omega_0'$ and $\Delta\theta$ (or equivalently, $\epsilon$, $\Delta\omega_0'$ and $\Delta\theta$).

It is a fundamental fact that by performing the differential of any signal {v(n)}, the CFO in the signal {v(n)} will manifest as a constant phase offset error in the differential signal, and the phase offset present in the signal {v(n)} will be removed from the differential signal. The differential signal $\nabla v(n)$ is defined as:

$$\nabla v(n)=v(n)v(n-1)^*. \quad (21)$$

The error vector e'(n) corresponding to the differential of the intermediate signal Y(n) and the differential of the reference signal r(n) is given by:

$$e'(n)=\nabla Y(n)-\nabla r(n). \quad (22)$$

Applying the definition of differential to the intermediate signal Y(n), one obtains:

$$\nabla Y(n)=A(nT_S')A((n-1)T_S')\exp\{j(\alpha(nT_S')-\alpha((n-1)T_S')-\Delta\omega_0'T_s')\}. \quad (23)$$

Observe that term involving the residual carrier frequency offset $\Delta\omega_0'$ appears as a constant phase offset, whereas the corresponding term in expression (9) was linear in index n.

Similarly, the differential of the reference signal r(n) is given by:

$$\nabla r(n)=A(nT_S)A((n-1)T_S)\exp\{j(\alpha(nT_S)-\alpha((n-1)T_S))\}. \quad (24)$$

Substituting (23) and (24) into (22) and applying the same assumptions as used in Case I, one obtains:

$$e'(n) = 2B(n)\exp\{j\psi(n)\}\sin\left(\frac{\beta(n)-\beta(n-1)}{2}\right), \quad (25A)$$

$$\psi(n) = \alpha(nT_s) - \alpha((n-1)T_s) + \frac{\beta(n)-\beta(n-1)}{2} + \frac{\pi}{2} \quad (25B)$$

Thus, the absolute value of the error vector e'(n) after normalization is given by:

$$|e'(n)| = \left|\sin\left(\frac{\beta(n)-\beta(n-1)}{2}\right)\right|. \quad (26)$$

Using the assumption (A2) described above in Case I, expression (26) may be written as:

$$|e'(n)| = \left|\sin\left(\frac{K\varepsilon}{2}\right)\right|. \quad (27)$$

(Recall that $\beta(n)\approx K\epsilon n$. But this implies $\beta(n)-\beta(n-1)\approx K\epsilon n-K\epsilon(n-1)=K\epsilon$.) And thus, under the condition that $|\epsilon|$ is small, one can write:

$$|e'(n)| = \frac{|K\varepsilon|}{2},$$

or equivalently, $$|\varepsilon| = \frac{2|e'(n)|}{|K|}. \quad (28)$$

The receiver may estimate $|\epsilon|$ according to the relation:

$$|\varepsilon| = \frac{2RMS\{|e'(n)|\}}{|K|}, \quad (29)$$

where the notation RMS {v(n)} denotes the RMS value of the sequence {v(n)}, i.e., $$RMS\{v(n)\} = \sqrt{\frac{1}{N}\sum_{k=0}^{N-1}|v(n)|^2}.$$

The value of the constant K may be derived by calibration, e.g., a calibration performed prior to operating on the received samples. The calibration procedure involves a set of baseband signal samples {S(nTs')} that have been stored into the memory of the receiver, as described above. At calibration time, the receiver may access the samples {S(nTs')} from memory, and perform the above-described computation of the value RMS {|e'(n)|} based on the samples {S(nTs')}. Furthermore, the receiver may access the intended period value Ts and the known period value Ts' from the memory, and compute the parameter $\alpha_0$ according to the formula:

$$\varepsilon_0 = \frac{T'_s - T_s}{T_s}.$$

Finally, the receiver may estimate the absolute value of the constant K based on the relation:

$$|K| = \frac{2\text{RMS}\{|e'(n)|\}}{|\varepsilon_0|}.$$

Resolving Sign Ambiguity

As noted above, either formula (17) or formula (29) may be used to compute the estimate for $|\epsilon|$. To determine the sign of $\epsilon$, the following procedure may be used. First, the receiver fractionally resamples the received baseband samples $\{x(nT_S')\}$ by a factor of $(1+|\epsilon|)$ to obtain a first resampled signal $\{Z_1(n)\}$ corresponding to the rate $f_1=(1+|\epsilon|)/T_S'$; and fractionally resamples the received baseband samples $\{x(nT_S')\}$ by a factor of $(1-|\epsilon|)$ to obtain a second resampled signal $\{Z_2(n)\}$ corresponding to the rate $f_2=(1-|\epsilon|)/T_S'$. Resampling by a factor p means the ratio of the number of output samples to the number of input samples is equal to p. (For example, if p=1001/1005, the resampling would produce 1001 output samples for every 1005 input samples.) (Note that the value of clock period $T_S'$ is as yet unknown. Thus, $f_1$ and $f_2$ are not yet known.)

Second, the receiver computes two error vector signals according to the expressions:

$$e_1(n)=Z_1(n)-r(n), \quad (30A)$$

$$e_1(n)=Z_2(n)-r(n). \quad (30B)$$

Third, the receiver computes two RMS values according to the expressions:

$$R_1=RMS\{|e_2(n)|\}, \quad (31A)$$

$$R_2=RMS\{|e_2(n)|\}. \quad (31B)$$

The smaller of the two RMS values determines the sign of $\epsilon$. In other words, if $R_1$ is smaller than $R_2$, the receiver sets the sign of $\epsilon$ to be positive, performs demodulation on the samples $\{Z_1(n)\}$, and discards the samples $\{Z_2(n)\}$. On the other hand, if $R_2$ is smaller than $R_1$, the receiver sets the sign of $\epsilon$ to be negative, performs demodulation on the samples $\{Z_2(n)\}$, and discards the samples $\{Z_1(n)\}$. The process of demodulation produces a sequence of bits that represent estimates of the original information bits $\{b_k\}$.

Methods for performing fractional resampling are well known to those of ordinary skill in the art of signal processing. For information on methods for performing fractional resampling, see, e.g., "Multirate Systems And Filter Banks" by P. P. Vaidyanathan, Prentice Hall PTR 1992 (ISBN: 0136057187).

In some embodiments, the receiver is a signal analyzer. In one embodiment, the signal analyzer includes one or more devices manufactured by National Instruments Corporation. For example, in one embodiment, the signal analyzer is the PXIe-5663E 6.6 Ghz RF Vector Signal Analyzer.

Figure 2:
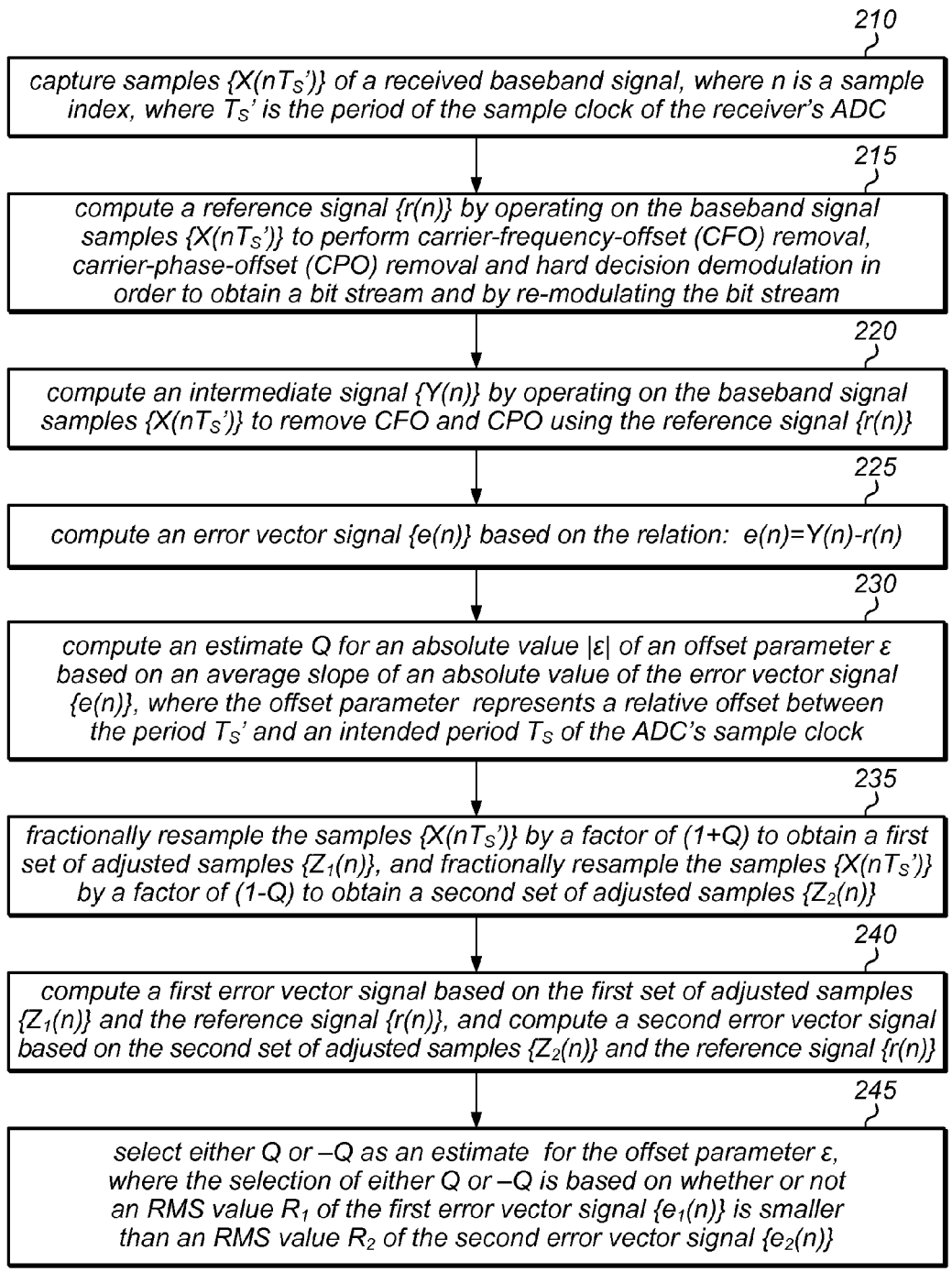
FIG. 2 illustrates one embodiment of a method for operating a receiver system.

In one set of embodiments, a method for operating a receiver system may involve the operations shown in FIG. 2.

At 210, an analog-to-digital converter (ADC) of the receiver system may capture samples $\{x(nT_S')\}$ of a received baseband signal, where n is the sample index, where $T_S'$ is the period of the ADC's sample clock. The receiver system may include hardware for receiving a signal from a transmission channel, and for down-converting the received signal to baseband. The baseband signal is provided to the ADC, which captures the samples of the baseband signal based on the sample clock. The actual period $T_S'$ of the sample clock is assumed to be unknown to the receiver system, at least initially. (After estimating the value of $\epsilon$ by the present method, however, the receiver system may use that estimate to compute a value for the period $T_S'$.)

At 215, a processor of the receiver system may compute a reference signal $\{r(n)\}$ by operating on the baseband signal samples $\{x(nT_S')\}$ to perform carrier-frequency-offset (CFO) removal, carrier-phase-offset (CPO) removal and hard decision demodulation in order to obtain a bit stream, and by remodulating the bit stream to determine by the reference signal, e.g., as variously described above.

At 220, the processor may compute an intermediate signal $\{Y(n)\}$ by operating on the baseband signal samples $\{x(nT_S')\}$ to perform CFO removal and CPO removal using the reference signal $\{r(n)\}$, e.g., as variously described above.

At 225, the processor may compute an error vector signal $\{e(n)\}$ based on the intermediate signal $\{Y(n)\}$ and the reference signal $\{r(n)\}$, e.g., according to the relation:

$$e(n)=Y(n)-r(n).$$

At 230, the processor may compute an estimate Q for the absolute value $|\epsilon|$ of an offset parameter $\epsilon$ based on an average slope of an absolute value of the error vector signal $\{e(n)\}$, e.g., as variously described above. The offset parameter $\epsilon$ represents a relative offset between the period $T_S'$ and an intended period $T_S$ of the ADC's sample clock.

At 235, the processor may fractionally resample the baseband signal samples $\{x(nT_S')\}$ by a factor of $(1+Q)$ to obtain a first set of adjusted samples $\{Z_1(n)\}$ corresponding to sample rate $f_1=(1+Q)/T_S'$, and fractionally resample the baseband signal samples $\{x(nT_S')\}$ by a factor of $(1-Q)$ to obtain a second set of adjusted samples $\{Z_2(n)\}$ corresponding to sample rate $f_2=(1-Q)/T_S'$, e.g., as variously described above.

At 240, the processor may compute a first error vector signal $\{e_1(n)\}$ based on the first set of adjusted samples $\{Z_1(n)\}$ and the reference signal $\{r(n)\}$, and compute a second error vector signal $\{e_2(n)\}$ based on the second set of adjusted samples $\{Z_2(n)\}$ and the reference signal $\{r(n)\}$, e.g., as described above.

At 245, the processor may select either Q or −Q as an estimate $\hat{\epsilon}$ for the offset parameter $\epsilon$, where the selection of either Q or −Q is based on whether or not an RMS value $R_1$ of the first error vector signal $\{e_1(n)\}$ is smaller than an RMS value $R_2$ of the second error vector signal $\{e_2(n)\}$. In other words, if $R_1$ is smaller than $R_2$, the value Q is selected as the estimate for $\epsilon$; otherwise the value −Q is selected.

After having selected the estimate $\hat{\epsilon}$ for the offset parameter $\epsilon$, that estimate may be stored in memory of the receiver, and/or, displayed to a user via a display device. In some embodiments, the above method may be performed repeatedly for a succession of blocks of the received signal samples. The sequence of estimates $\hat{\epsilon}(k)$ thereby generated may be graphed (or otherwise displayed) to give the user a sense of the time-variation of the ADC's sample clock period (or frequency).

In some embodiments, the processor may output (e.g., display) either the value $1/((1+Q)T_S)$ or the value $1/((1-Q)T_S)$ as an estimate of the frequency $1/T_S'$ of the ADC's sample clock based on whether or not the RMS value $R_1$ of the first error vector signal is smaller than the RMS value $R_2$ of the second error vector signal. In other words, if $R_1$ is smaller than $R_2$, the value $1/((1+Q)T_S)$ is outputted; otherwise the value $1/((1-Q)T_S)$ is outputted. The intended period value $T_S$ is assumed to be a known parameter, e.g., known by virtue of the communication protocol being employed and the SPS factor being used by the receiver. Thus, the values $1/((1+Q)T_S)$ and $1/((1-Q)T_S)$ may be computed once the value Q has been computed.

In some embodiments, the processor may select either the first set of adjusted samples $\{Z_1(n)\}$ or the second set of adjusted samples $\{Z_2(n)\}$ for output based on whether or not the RMS value $R_1$ of the first error vector signal is smaller than the RMS value $R_2$ of the second error vector signal. In other words, the first set of adjusted samples $\{Z_1(n)\}$ is selected if $R_1$ is smaller than $R_2$; otherwise the second set of adjusted samples $\{Z_2(n)\}$ is selected. The selected set of adjusted samples represents a resampling of the samples $\{x(nT_S')\}$ to the intended sample rate $1/T_S$. The non-selected set of samples may be discarded.

The processor may output the selected set of adjusted samples. The process of outputting the selected set of adjusted samples may involve storing the selected set of adjusted samples in an output buffer, e.g., a buffer that is accessible by a demodulation process (or some other computational process) that executes as part of the receiver system or as part of some system/device external to the receiver system.

In some embodiments, the processor (or some other processing agent) may demodulate the selected set of adjusted samples in order to recover information bits. (The demodulation corresponds to the type of modulation used by the transmitter, e.g., QAM in one embodiment.) The information bits may be stored in memory, e.g., as part of an output file or output packet. In one embodiment, the processor may generate an output signal based on the information bits (e.g., an audio signal and/or a video signal), and provide the output signal to an output device. The output device may be a display device and/or a set of one or more speakers.

As described above, the processor computes (in operation 230) an estimate Q for the absolute value of the offset parameter $\epsilon$ based on an average slope of the absolute value of the error vector signal $\{e(n)\}$. In one embodiment, the average slope is computed according to the expression:

$$AVG\{grad(|e(n)|)\} = \frac{\sum_{n=1}^{N-1}(|e(n)| - |e(n-1)|)}{N-1},$$

where N is the number of samples of the error vector signal $\{e(n)\}$.

In some embodiments, the smaller of the two values $R_1$ and $R_2$ may be outputted as a measure of quality of the transmitter. (The received baseband signal is a noise-perturbed version of a transmitted baseband signal generated by a transmitter.)

In some embodiments, the receiver system is (or includes) a signal analyzer. In one embodiment, the signal analyzer is realized by the PXIe-5663E 6.6 Ghz RF Vector Signal Analyzer provided by National Instruments Corporation.

In some embodiments, the receiver is a mobile telecommunication device, e.g., a mobile phone.

In some embodiments, the receiver is a network interface for a computer system.

Figure 3:
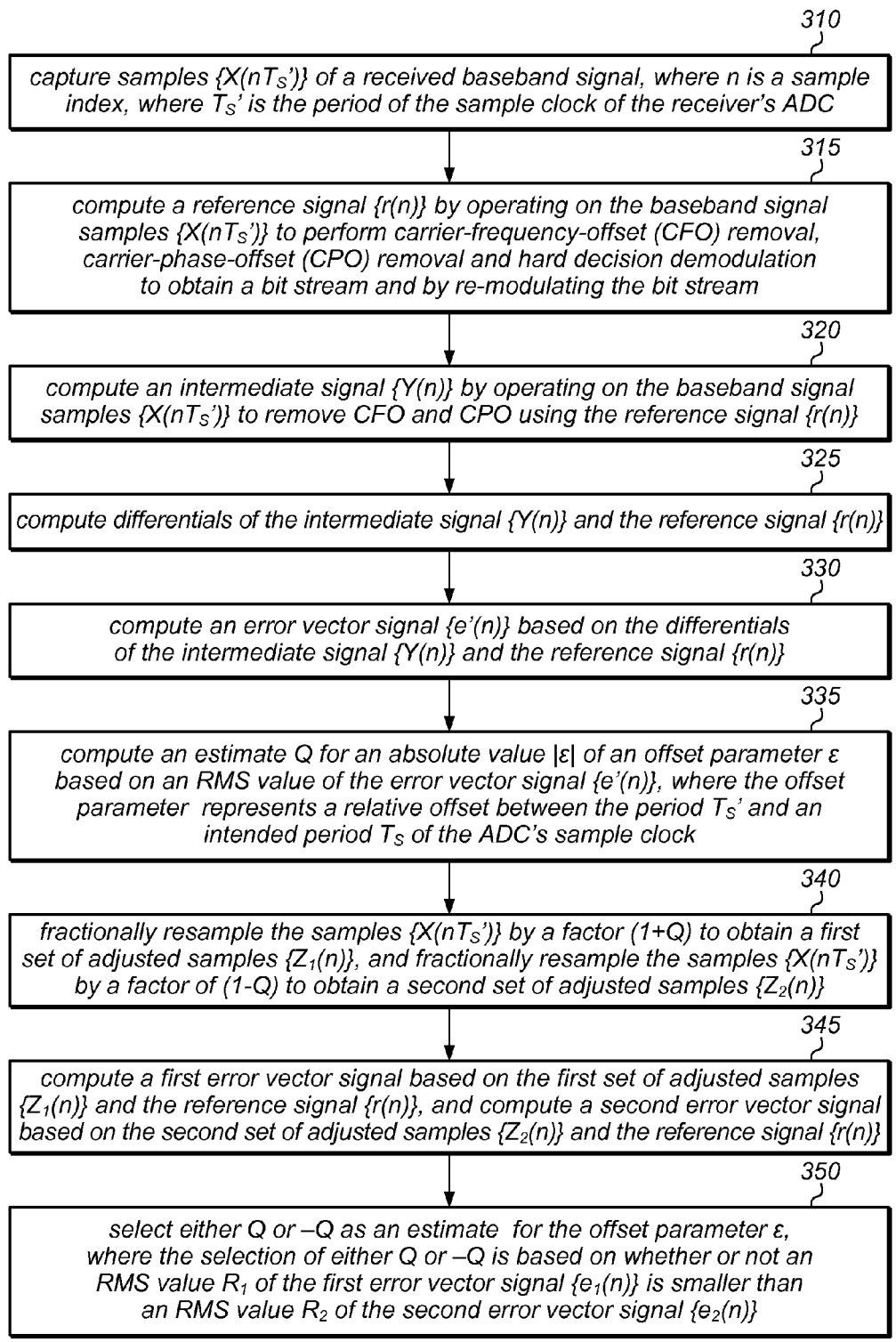
FIG. 3 illustrates one embodiment of a second method for operating a receiver system.

In one set of embodiments, a method for operating a receiver system may involve the operations shown in FIG. 3.

At 310, an analog-to-digital converter (ADC) of the receiver system may capture samples $\{x(nT_S')\}$ of a received baseband signal, where n is a sample index, where $T_S'$ is a period of the sample clock used by the ADC. The receiver system may include hardware for receiving a signal from a transmission channel, and for down-converting the signal to baseband. The baseband signal is provided to the ADC, which captures the samples of the baseband signal based on the sample clock. The actual period $T_S'$ of the sample clock is assumed to be unknown to the receiver system, at least initially. (After estimating the value of $\epsilon$ by the present method, however, the receiver may estimate the value of period $T_S'$ using the known value of the intended period $T_S$.)

At 315, a processor of the receiver system may compute a reference signal $\{r(n)\}$ by operating on the baseband signal samples $\{x(nT_S')\}$ to perform carrier-frequency-offset (CFO) removal, carrier-phase-offset (CPO) removal and hard decision demodulation in order to obtain a bit stream, and by remodulating the bit stream, e.g., as variously described above.

At 320, the processor may compute an intermediate signal $\{Y(n)\}$ by operating on the baseband signal samples $\{x(nT_S')\}$ to perform CFO removal and CPO removal using the reference signal $\{r(n)\}$, e.g., as described above.

At 325, the processor may compute a differential $\{\nabla r(n)\}$ of the reference signal $\{r(n)\}$ and a differential $\{\nabla Y(n)\}$ of the intermediate signal $\{Y(n)\}$, e.g., as described above. See expression (21) above for a definition of the differential operator $\nabla$.

At 330, the processor may compute an error vector signal $\{e'(n)\}$ based on the differential signal $\{\nabla Y(n)\}$ and the differential signal $\{\nabla r(n)\}$, e.g., according to the relation: $e'(n) = \nabla Y(n) - \nabla r(n)$.

At 335, the processor may compute an estimate Q for the absolute value $|\epsilon|$ of an offset parameter $\epsilon$ based on an RMS value of the error vector signal $\{e'(n)\}$, e.g., as variously described above. The offset parameter $\epsilon$ represents a relative offset between the period $T_S'$ and an intended period $T_S$ of the ADC's sample clock.

At 340, the processor may: fractionally resample the baseband signal samples $\{x(nT_S')\}$ by a factor of $(1+Q)$ to obtain a first set of adjusted samples $\{Z_1(n)\}$ corresponding to sample rate $f_1 = (1+Q)/T_S'$; and fractionally resample the baseband signal samples $\{x(nT_S')\}$ by a factor of $(1-Q)$ to obtain a second set of adjusted samples $\{Z_2(n)\}$ corresponding to sample rate $f_2 = (1-Q)/T_S'$. Techniques for performing fractional resampling are well known to those of ordinary skill in the art of signal processing, and thus need not be explained here.

At 345, the processor may compute a first error vector signal $\{e_1(n)\}$ based on the first set of adjusted samples $\{Z_1(n)\}$ and the reference signal $\{r(n)\}$, and compute a second error vector signal $\{e_2(n)\}$ based on the second set of adjusted samples $\{Z_2(n)\}$ and the reference signal $\{r(n)\}$, e.g., as described above.

At 350, the processor selects either Q or $-Q$ as an estimate for the offset parameter $\epsilon$, where the selection of either Q or $-Q$ is based on whether or not an RMS value $R_1$ of the first error vector signal $\{e_1(n)\}$ is smaller than an RMS value $R_2$ of the second error vector signal $\{e_2(n)\}$. In other words, the value Q is selected if $R_1$ is smaller than $R_2$; otherwise the value $-Q$ is selected.

After having selected the estimate $\hat{\epsilon}$ for the offset parameter $\epsilon$, that estimate may be stored in memory of the receiver, and/or, displayed to a user via a display device.

In some embodiments, the processor may output (e.g., display) either the value $1/((1+Q)T_S)$ or the value $1/((1-Q)T_S)$ as an estimate of the frequency $1/T_S'$ of the ADC's sample clock based on whether or not the RMS value $R_1$ of the first error vector signal is smaller than the RMS value $R_2$ of the second error vector signal. In other words, the value $1/((1+Q)T_S)$ is selected if $R_1$ is smaller than $R_2$; otherwise the value $1/((1-Q)T_S)$ is selected.

In some embodiments, the processor may select either the first set of adjusted samples $\{Z_1(n)\}$ or the second set of adjusted samples $\{Z_2(n)\}$ for output based on whether or not the RMS value $R_1$ of the first error vector signal is smaller than the RMS value $R_2$ of the second error vector signal. In other words, the first set of adjusted samples $\{Z_1(n)\}$ is selected if $R_1$ is smaller than $R_2$; otherwise the second set of adjusted samples $\{Z_2(n)\}$ is selected. The selected set of adjusted samples represents a resampling of the received baseband samples $\{x(nT_S')\}$ to the intended sample rate $1/T_S$. The non-selected set of samples may be discarded.

The processor may output the selected set of adjusted samples. The process of outputting the selected set of adjusted samples may involve storing the selected set of adjusted samples in an output buffer, e.g., a buffer that is accessible by a demodulation process (or some other computational process) that executes as part of the receiver system or as part of some system/device external to the receiver system.

In some embodiments, the processor (or some other processing agent) may demodulate the selected set of adjusted samples in order to recover information bits. (The demodulation corresponds to the type of modulation used by the transmitter, e.g., QAM in one embodiment.) The information bits may be stored in memory, e.g., as part of an output file or output packet. In one embodiment, the processor may generate an output signal based on the information bits (e.g., an audio signal and/or a video signal), and provide the output signal to an output device. The output device may be a display device and/or a set of one or more speakers.

In some embodiments, the smaller of the two values $R_1$ and $R_2$ may be outputted as a measure of quality of the transmitter, i.e., the transmitter that the receiver is in communication with. (The received baseband signal is a noise-perturbed version of a transmitted baseband signal generated by the transmitter.) In one embodiment, the transmitter is device (e.g., a mobile transmitter or transceiver device such as a cell phone) that is being tested.

In some embodiments, the receiver system is (or includes) a signal analyzer. In one embodiment the signal analyzer is realized by one or more products provided by National Instruments Corporation, as described above.

In one set of embodiments, a method for operating a receiver system may involve the following operations.

The method may involve a processor of the receiver system computing a reference signal $\{r(n)\}$ by operating on baseband signal samples $\{x(nT_S')\}$ to perform carrier-frequency-offset (CFO) removal, carrier-phase-offset (CPO) removal and hard decision demodulation in order to obtain a bit stream, and by remodulating the bit stream, e.g., as variously described above. The index n is a sample index, and $T_S'$ is the period of the sample clock of the ADC.

The method may also involve the processor computing an intermediate signal $\{Y(n)\}$ by operating on the baseband signal samples $\{x(nT_S')\}$ to perform CFO removal and CPO removal using the reference signal $\{r(n)\}$, e.g., as variously described above.

The method may also involve the processor computing an error vector signal $\{e(n)\}$ based on the intermediate signal $\{Y(n)\}$ and the reference signal $\{r(n)\}$. As described above, the error vector signal may be computed by subtracting the reference signal from the intermediate signal. In one embodiment, the error vector signal is computed by subtracting the differential from the reference signal from the differential of the intermediate signal, as described above.

The method may also involve the processor computing an estimate Q for the absolute value $|\epsilon|$ of an offset parameter $\epsilon$ based on the error vector signal $\{e(n)\}$, e.g., as variously described above. The offset parameter $\epsilon$ represents a relative offset between the period $T_S'$ and an intended period $T_S$ of the sample clock of the ADC.

The method may also involve the processor fractionally resampling the baseband signal samples $\{x(nT_S')\}$ by a factor of $(1+Q)$ to obtain a first set of adjusted samples $\{Z_1(n)\}$, and fractionally resampling the baseband signal samples $\{x(nT_S')\}$ by a factor of $(1-Q)$ to obtain a second set of adjusted samples $\{Z_2(n)\}$.

The method may also involve the processor selecting either Q or –Q as an estimate for the offset parameter $\epsilon$, wherein said selecting of either Q or –Q is based on whether or not an error vector signal $\{e_1(n)\}$ corresponding to the first set of adjusted samples $\{Z_1(n)\}$ has smaller energy than an error vector signal $\{e_2(n)\}$ corresponding to the second set of adjusted samples $\{Z_2(n)\}$.

Simulation Results

Figure 4:
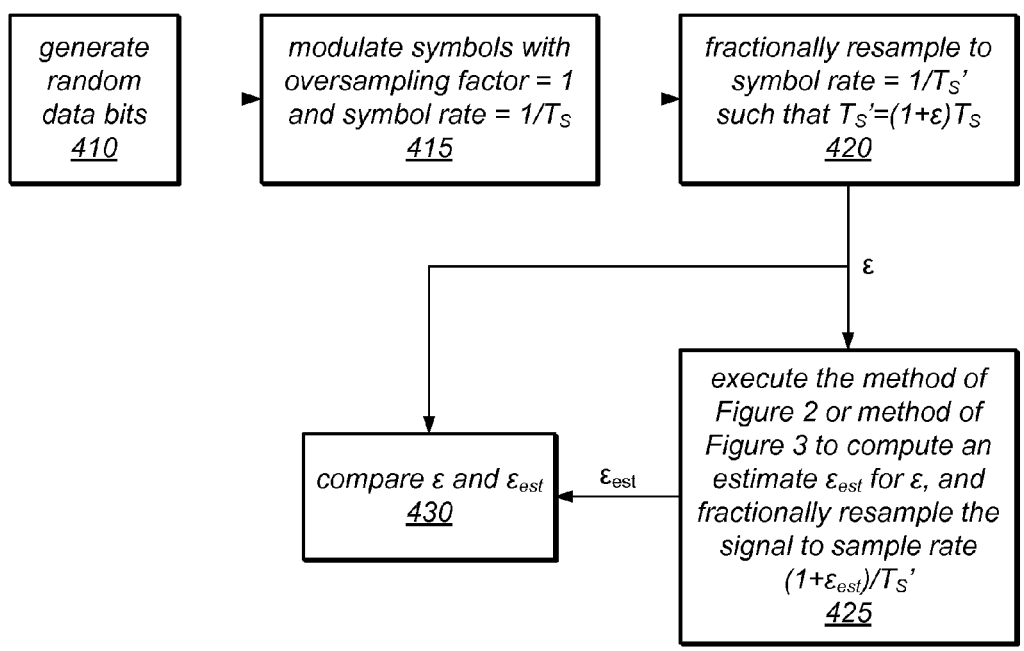
FIG. 4 illustrates one embodiment of a simulation framework used to simulate the methods of FIG. 3 and FIG. 4.

In one embodiment, the above-described methods and a simulation framework for testing the methods are implemented using the LabVIEW graphical programming language. (LabVIEW is a software product of National Instruments.) One embodiment of the simulation framework is shown in FIG. 4.

At 410, a stream of random bits is generated.

At 415, the bits are modulated using a given modulation scheme, e.g., QPSK, 16QAM or 64QAM. The modulation generates a sequence of baseband symbols $\{U_n\}$ at rate $1/T_S$ with oversampling factor equal to one. (While the simulation framework of FIG. 4 uses an oversampling factor equal to one, the present inventions do not impose any constraint on the oversampling factor.) The modulated signal is used as the test input signal.

Given a value of the relative clock period offset $\epsilon$, the modulated signal is fractionally resampled to symbol rate $1/T_S'$, where $T_S'=(1+\epsilon)T_S$. See block 420 of FIG. 4. The fractional resampling produces the baseband signal samples $\{x(nT_S')\}$.

At 425, the method of FIG. 2 or the method of FIG. 3 is then performed on the baseband signal samples $\{x(nT_S')\}$ to obtain an estimate $\epsilon_{est}$ for the relative clock period offset $\epsilon$ and to fractionally resample the signal to the rate $(1+\epsilon_{est})/T_S'$.

At 430, the estimate $\epsilon_{est}$ and the relative clock period offset $\epsilon$ may be compared, e.g., by calculating their difference. Both values and the difference may be stored in memory for later visualization and/or analysis.

FIG. 5 is a table showing one configuration that was used for simulation within the above framework.

FIG. 6 shows the clock frequency offset $(f_S'-f_S)$ introduced by the simulation, and the corresponding estimated value of the clock frequency offset using the algorithm of Case 1. (These results are based on the configuration shown in FIG. 5.)

Figure 7:
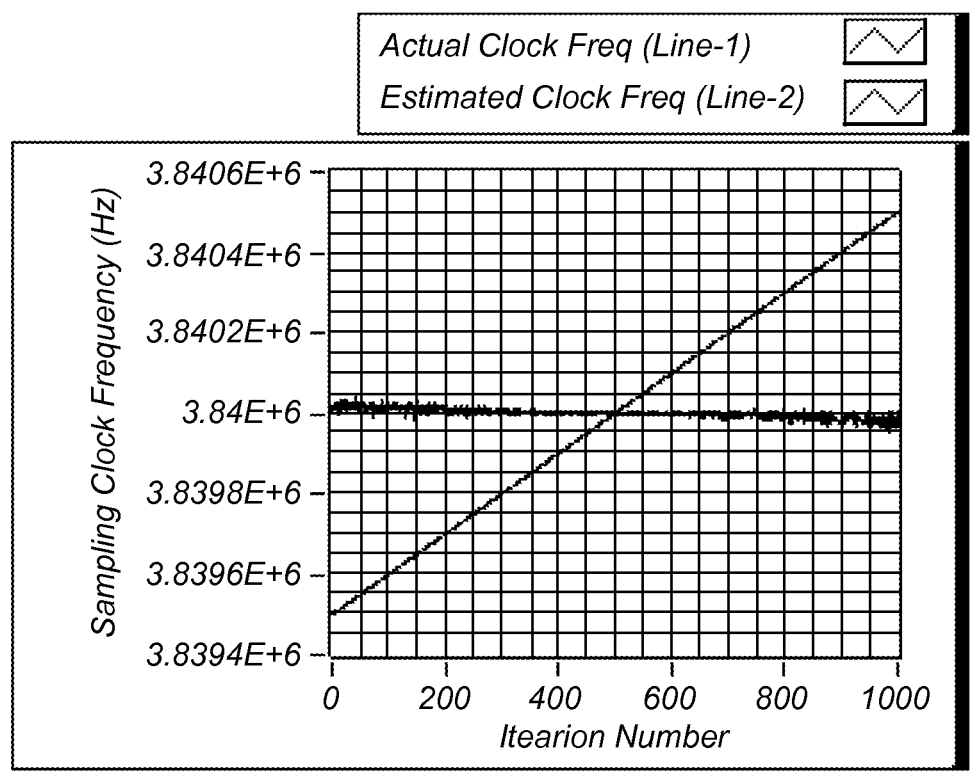
FIG. 7 is a graph showing the actual sample clock rate introduced into the baseband signal vs. iteration number, and the estimated sample clock rate vs. iteration number for the configuration given in FIG. 5.

Using the above simulation framework with the configuration of FIG. 5, the sample clock frequency offset is simulated by varying the sample clock frequency from –500 Hz to +500 Hz in steps of 1 Hz. In every iteration, the clock frequency offset is estimated and the impaired signal is corrected for the same by the algorithm of Case 1. The graph representing the sampling rate (Hz) vs. iteration number is shown in the FIG. 7. Line-1 (the line with steeper slope) represents the sample clock rate used to sample the baseband signal under test. Line-2 (the line with smaller average slope) represents the estimated sample clock frequency using the algorithm of Case 1. The experiments were also carried out with different values of CFO and different values of CPO.

Figure 8A:
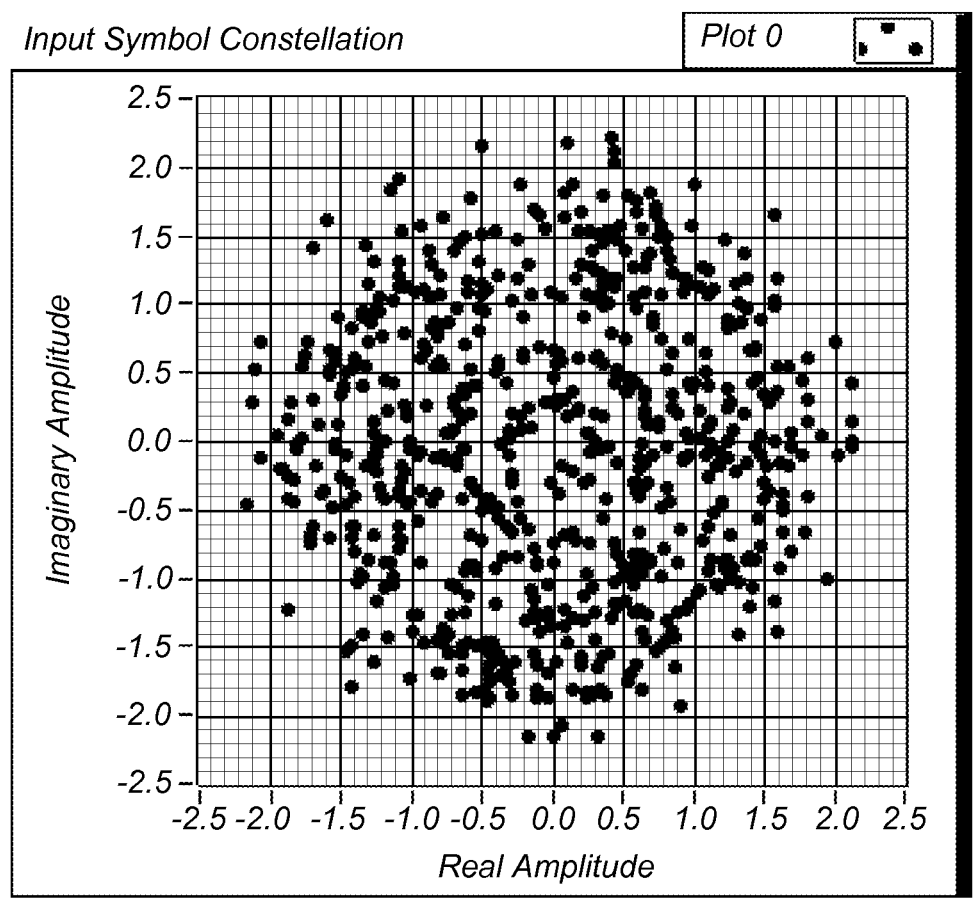
FIGS. 8A and 8B represent the baseband 64QAM signal constellation before (FIG. 8A) and after (FIG. 8A) correction of the clock frequency offset using the method of FIG. 2.
Figure 8B:
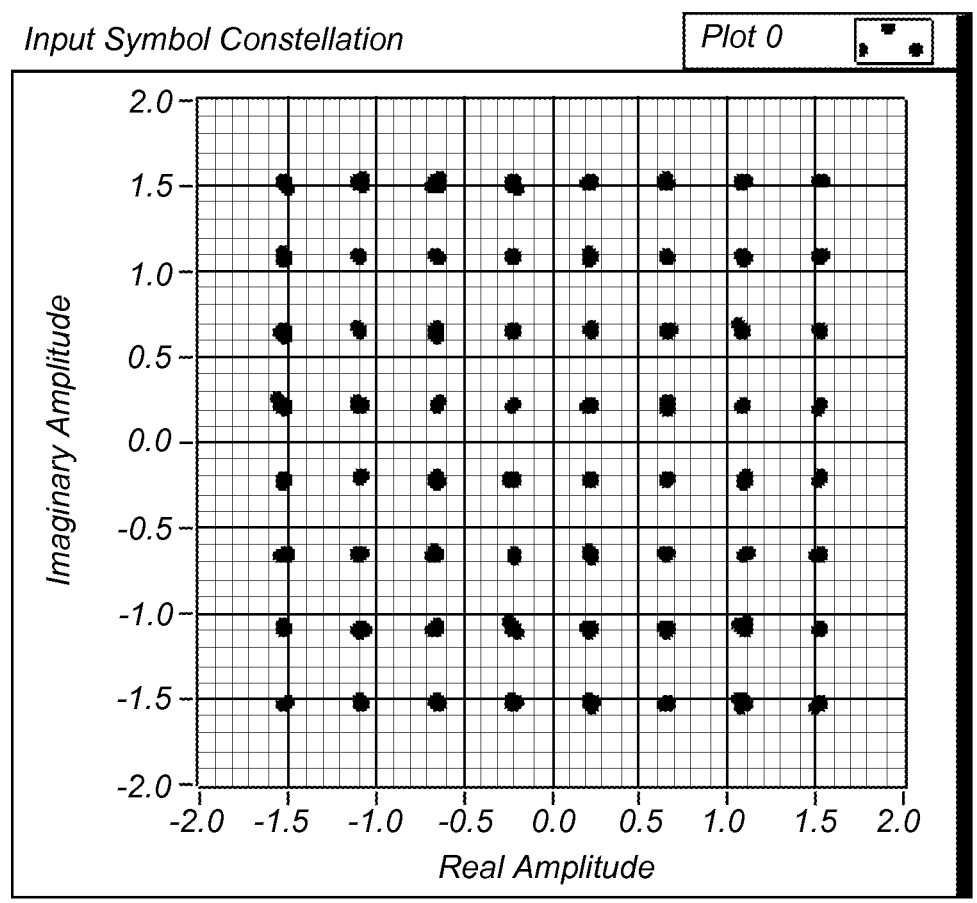

FIGS. 8A and 8B represent the baseband 64QAM signal constellation before (FIG. 8A) and after (FIG. 8A) correction of the clock frequency offset using the algorithm of Case 1. In particular, FIG. 8A shows the constellation of the input 64QAM baseband signal with the following impairments: CFO=1 Khz, CPO=25 degrees, Sample clock frequency offset=−499 Hz. FIG. 8B shows the constellation of the 64QAM baseband signal after having applied the clock frequency offset correction as well as CFO and CPO correction.

Figure 9A:
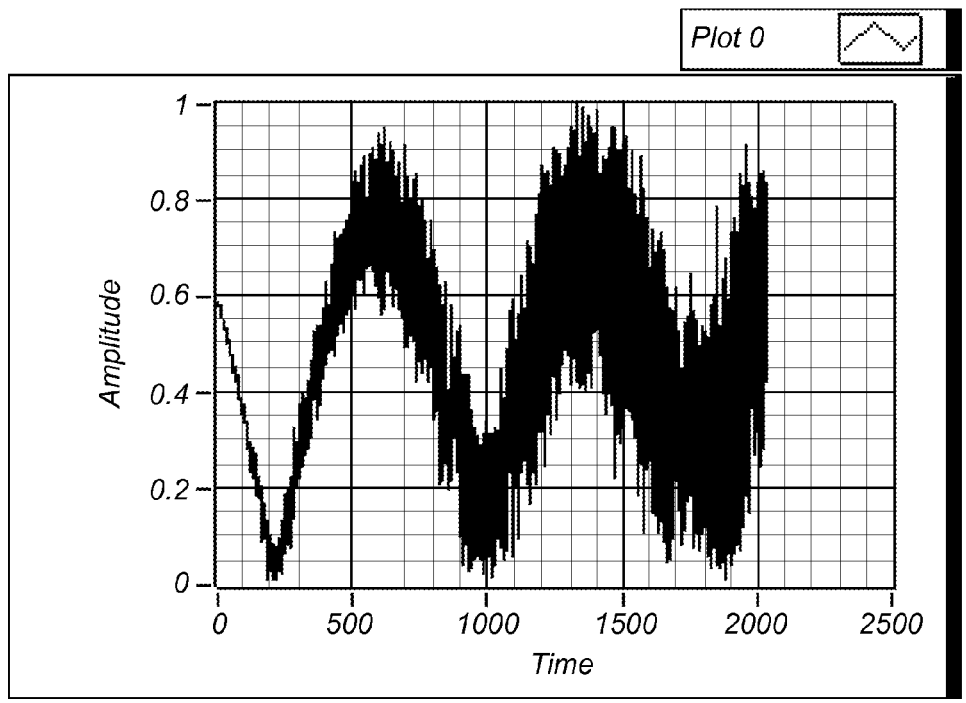
FIGS. 9A and 9B shows the plot of the EVM function |e(n)| respectively for clock frequency offset=1149 Hz and clock frequency offset=−326 Hz, but without CFO or CPO impairments.
Figure 9B:
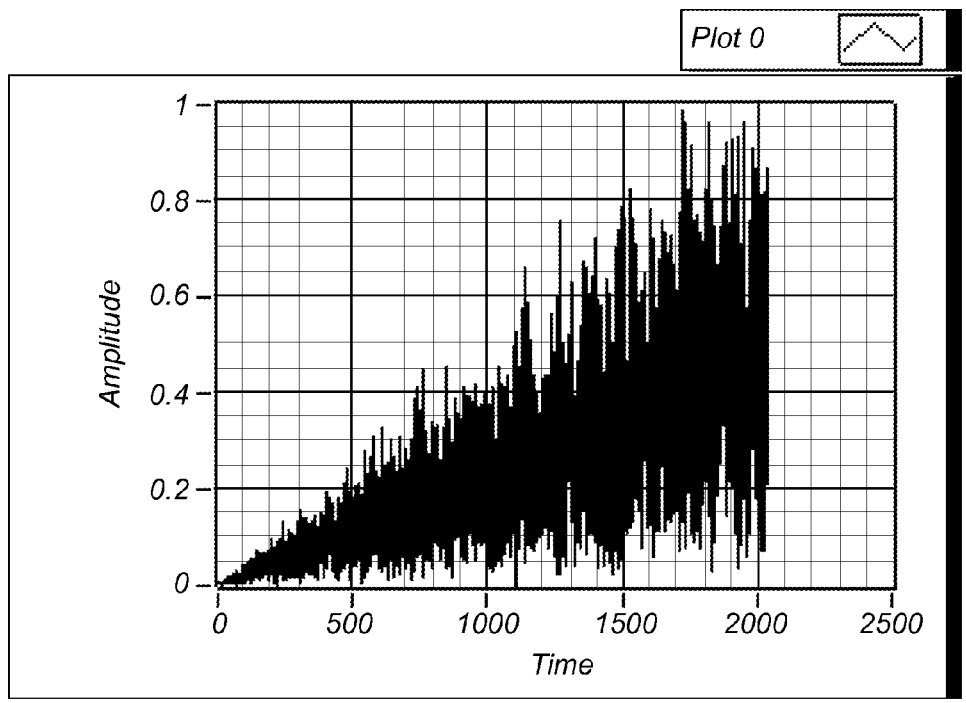

FIGS. 9A and 9B shows the plot of the EVM function |e(n)| respectively for clock frequency offset=1149 Hz and clock frequency offset=−326 Hz, but without CFO or CPO impairments. The intended sample clock frequency is 3.84 Mhz. The length of the signal is 4096 symbols at an oversampling factor of 1. The signal is a 64QAM modulated signal. It can be seen from FIG. 9A that the plot of |e(n)| agrees with the analytically-derived expression (13). Similarly, the plot of |e(n)| given in FIG. 9B for smaller values of clock frequency offset agrees with the analytically-derived expression (14).

Figure 10:
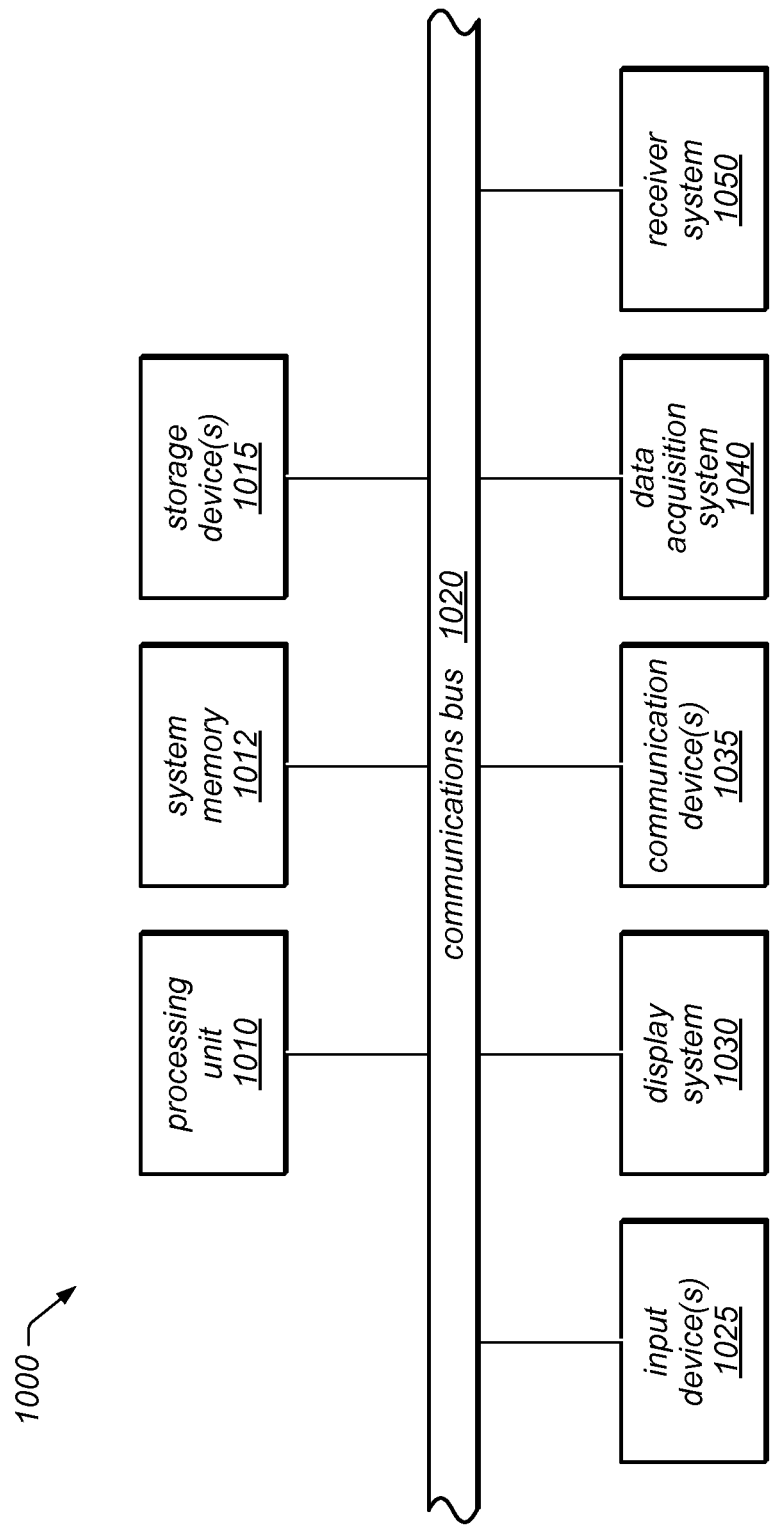
FIG. 10 illustrates one embodiment of a computer system that may be used to perform any of the method embodiments described herein.

FIG. 10 illustrates one embodiment of a computer system 1000 that may be used to perform any of the method embodiments described herein, or, any combination of the method embodiments described herein, or any subset of any of the method embodiments described herein, or, any combination of such subsets.

Computer system 1000 may include a processing unit 1010, system memory 1012, a set 1015 of one or more storage devices, a communication bus 1020, a set 1025 of input devices, and a display system 1030.

System memory 1012 may include a set of semiconductor devices such as RAM devices (and perhaps also a set of ROM devices).

Storage devices 1015 may include any of various storage devices such as one or more memory media and/or memory access devices. For example, storage devices 1015 may include devices such as a CD/DVD-ROM drive, a hard disk, a magnetic disk drive, magnetic tape drives, etc.

Processing unit 1010 is configured to read and execute program instructions, e.g., program instructions stored in system memory 1012 and/or on one or more of the storage devices 1015. Processing unit 1010 may couple to system memory 1012 through communication bus 1020 (or through a system of interconnected busses). The program instructions configure the computer system 1000 to implement a method, e.g., any of the method embodiments described herein, or, any combination of the method embodiments described herein, or, any subset of any of the method embodiments described herein, or, any combination of such subsets.

Processing unit 1010 may include one or more processors (e.g., microprocessors).

One or more users may supply input to the computer system 1000 through the input devices 1025. Input devices 1025 may include devices such as a keyboard, a mouse, a touch-sensitive pad, a touch-sensitive screen, a drawing pad, a track ball, a light pen, a data glove, eye orientation and/or head orientation sensors, a microphone (or set of microphones), or any combination thereof.

The display system 530 may include any of a wide variety of display devices representing any of a wide variety of display technologies. For example, the display system may be a computer monitor, a head-mounted display, a projector system, a volumetric display, or a combination thereof. In some embodiments, the display system may include a plurality of display devices. In one embodiment, the display system may include a printer and/or a plotter.

In some embodiments, the computer system 1000 may include other devices, e.g., devices such as one or more graphics accelerators, one or more speakers, a sound card, a video camera and a video card.

In some embodiments, computer system 1000 may include one or more communication devices 1035, e.g., a network interface card for interfacing with a computer network. In one embodiment, such a communication device may be used to receive a modulated signal and perform processing operations on the modulated signal. The communication device may include an embedded processor (such as a microprocessor) configured to execute program instructions and/or a programmable hardware element (such as an FPGA). The communication devices 1035 are preferably configured to operate under the control of the software executing on processor 1010.

In some embodiments, the computer system 1000 may be configured for coupling to a data acquisition system 1040. The data acquisition system 1040 is configured to receive analog inputs signals, to digitize the analog input signals, and to process the digitized signals and/or to make the digitized signals available to other processing agents of the computer system 1000, e.g., to processor 1010.

In some embodiments, the computer system 1000 may interface with a receiver 1050 configured for receiving signals (such as radio signals, RF signals, wireless LAN signals, optical signals, etc.), down-converting the received signals, and capturing samples the down-converted signals. The receiver may process the captured samples and/or make the captured samples available to other processing agents of the computer system 1000, e.g., to processor 1010. The receiver may also include an embedded processor (configured to execute program instructions) and/or a programmable hardware element (such as an FPGA). Thus, the computational effort of processing the captured samples may be divided in various ways between the receiver and processor 1010. Any of the method embodiments described herein may be performed entirely on the receiver, entirely on the processor 1010, or partly in the receiver and partly on the processor 1010.

The computer system may be configured with a software infrastructure including an operating system, and perhaps also, one or more graphics APIs (such as OpenGL®, Direct3D, Java 3D™).

In some embodiments, the computer system 1000 may be provided with software tools allowing a user to build programs (e.g., graphical programs). The software tools may enable the user to specify a target device on which a program is to be executed/realized. For example, the user may specify that a program may be realized on a processor and/or a programmable hardware element of a peripheral device such as receiver 1050 or one or more of the communication devices 1035. For example, the computer system 1000 may be provided with a copy of LabVIEW and/or LabVIEW FPGA, which are software products of National Instruments Corporation.

Figure 11:
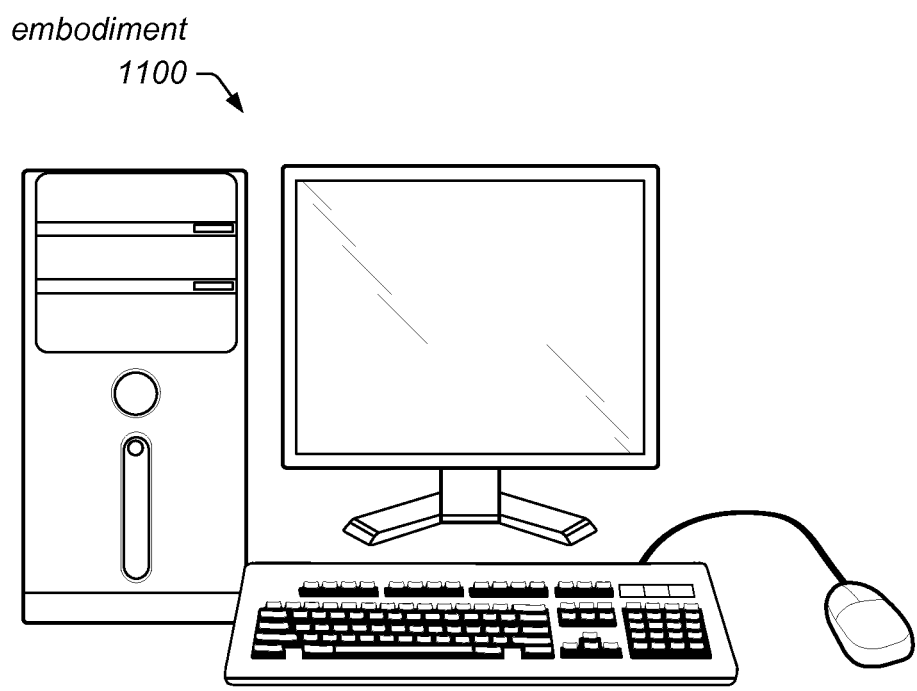
FIG. 11 illustrates one possible embodiment of the computer system of FIG. 10.

FIG. 11 illustrates one possible embodiment 1100 of computer system 1000. Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for operating a receiver system, the method comprising:
   capturing, at an analog-to-digital converter (ADC) of the receiver system, samples $\{x(nT_S')\}$ of a received baseband signal, wherein n is a sample index, where $T_S'$ is a period of a sample clock of the ADC;
   computing, at a processor of the receiver system, a reference signal $\{r(n)\}$ by operating on the baseband signal samples $\{x(nT_S')\}$ to perform carrier frequency offset (CFO) removal, carrier phase offset (CPO) removal and hard decision demodulation in order to obtain a bit stream and by remodulating the bit stream;
   computing, at the processor, an intermediate signal $\{Y(n)\}$ by operating on the baseband signal samples $\{x(nT_S')\}$ to perform CFO removal and CPO removal using the reference signal $\{r(n)\}$;
   computing, at the processor, an error vector signal $\{e(n)\}$ based on the intermediate signal $\{Y(n)\}$ and the reference signal $\{r(n)\}$;
   computing, at the processor, an estimate Q for the absolute value $|\epsilon|$ of an offset parameter $\epsilon$ based on an average slope of an absolute value of the error vector signal $\{e(n)\}$, wherein the offset parameter $\epsilon$ represents a relative offset between the period $T_S'$ and an intended period $T_S$ of the sample clock of the ADC;
   fractionally resampling, at the processor, the baseband signal samples $\{x(nT_S')\}$ by a factor of $(1+Q)$ to obtain a first set of adjusted samples $\{Z_1(n)\}$ corresponding to sample rate $f_1=(1+Q)/T_S'$, and fractionally resampling, at the processor, the baseband signal samples $\{x(nT_S')\}$ by a factor of $(1-Q)$ to obtain a second set of adjusted samples $\{Z_2(n)\}$ corresponding to sample rate $f_2=(1-Q)/T_S'$;
   computing, at the processor, a first error vector signal $\{e_1(n)\}$ based on the first set of adjusted samples $\{Z_1(n)\}$ and the reference signal $\{r(n)\}$, and computing, at the processor, a second error vector signal $\{e_2(n)\}$ based on the second set of adjusted samples $\{Z_2(n)\}$ and the reference signal $\{r(n)\}$; and
   selecting, at the processor, either Q or −Q as an estimate for the offset parameter $\epsilon$, wherein said selecting of either Q or −Q is based on whether or not a root mean square (RMS) value $R_1$ of the first error vector signal $\{e_1(n)\}$ is smaller than an RMS value $R_2$ of the second error vector signal $\{e_2(n)\}$.

2. The method of claim 1, further comprising:
   outputting, at the processor, either a value $1/((1+Q)T_S)$ or a value $1/((1-Q)T_S)$ as an estimate of a frequency $1/T_S'$ of the sample clock of the ADC based on whether or not the RMS value $R_1$ of the first error vector signal is smaller than the RMS value $R_2$ of the second error vector signal.

3. The method of claim 1, further comprising:
   selecting, at the processor, either the first set of adjusted samples $\{Z_1(n)\}$ or the second set of adjusted samples $\{Z_2(n)\}$ for output based on whether or not the RMS value $R_1$ of the first error vector signal is smaller than the RMS value $R_2$ of the second error vector signal, wherein the selected set of adjusted samples represents a resampling of the samples $\{x(nT_S')\}$ to a sample rate $1/T_S$.

4. The method of claim 3, further comprising:
   demodulating the selected set of adjusted samples to recover information bits;
   generating an output signal based on the information bits; and
   providing the output signal to an output device.

5. The method of claim 1, wherein the received baseband signal is a noise-perturbed version of a transmitted baseband signal generated by a transmitter, wherein the method further comprises:
   outputting, at the processor, a smaller one of the values $R_1$ and $R_2$, wherein the smaller value represents a measure of quality of the transmitter.

6. A non-transitory computer-readable memory medium for operating a receiver system, wherein the memory medium stores program instructions, wherein the program instructions, when executed by a processor, cause the processor to perform a method comprising:
   directing an analog-to-digital converter (ADC) to capture samples $\{x(nT_S')\}$ of a received baseband signal, wherein n is a sample index, where $T_S'$ is a period of a sample clock of the ADC;
   computing a reference signal $\{r(n)\}$ by operating on the baseband signal samples $\{x(nT_S')\}$ to perform carrier frequency offset (CFO) removal, carrier phase offset (CPO) removal and hard decision demodulation in order to obtain a bit stream, and by remodulating the bit stream;
   computing an intermediate signal $\{Y(n)\}$ by operating on the baseband signal samples $\{x(nT_S')\}$ to perform CFO removal and CPO removal using the reference signal $\{r(n)\}$;
   computing an error vector signal $\{e(n)\}$ based on the intermediate signal $\{Y(n)\}$ and the reference signal $\{r(n)\}$;
   computing an estimate Q for the absolute value $|\epsilon|$ of an offset parameters based on an average slope of an absolute value of the error vector signal $\{e(n)\}$, wherein the offset parameters $\epsilon$ represents a relative offset between the period $T_S'$ and an intended period $T_S$ of the sample clock of the ADC;
   resampling the baseband signal samples $\{x(nT_S')\}$ by a factor of $(1+Q)$ to obtain a first set of adjusted samples $\{Z_1(n)\}$ corresponding to sample rate $f_1=(1+Q)/T_S'$, and fractionally resampling the baseband signal samples $\{x(nT_S')\}$ by a factor of $(1-Q)$ to obtain a second set of adjusted samples $\{Z_2(n)\}$ corresponding to sample rate $f_2=(1-Q)/T_S'$;
   computing a first error vector signal $\{e_1(n)\}$ based on the first set of adjusted samples $\{Z_1(n)\}$ and the reference signal $\{r(n)\}$, and computing a second error vector signal $\{e_2(n)\}$ based on the second set of adjusted samples $\{Z_2(n)\}$ and the reference signal $\{r(n)\}$; and
   selecting either Q or −Q as an estimate for the offset parameter $\epsilon$, wherein said selecting of either Q or −Q is based on whether or not a root mean square (RMS) value $R_1$ of the first error vector signal is smaller than an RMS value $R_2$ of the second error vector signal.

7. The memory medium of claim 6, wherein the method further comprises:
   outputting either a value $1/((1+Q)T_S)$ or a value $1/((1--Q)T_S)$ as an estimate of a frequency $1/T_S'$ of the sample clock of the ADC based on whether or not the RMS value $R_1$ of the first error vector signal is smaller than the RMS value $R_2$ of the second error vector signal.

8. The memory medium of claim 6, wherein the method further comprises:
   selecting either the first set of adjusted samples $\{Z_1(n)\}$ or the second set of adjusted samples $\{Z_2(n)\}$ for output based on whether or not the RMS value $R_1$ of the first error vector signal is smaller than the RMS value $R_2$ of the second error vector signal, wherein the selected set of adjusted samples represents a resampling of the samples $\{x(nT_S')\}$ to a sample rate $1/T_S$.

9. The memory medium of claim 8, wherein the method further comprises:
   demodulating the selected set of adjusted samples to recover information bits;
   generating an output signal based on the information bits; and
   providing the output signal to an output device.

10. The memory medium of claim 6, wherein the received baseband signal is a noise-perturbed version of a transmitted baseband signal generated by a transmitter, wherein the method further comprises:
   outputting a smaller one of the values $R_1$ and $R_2$, wherein the smaller value represents a measure of quality of the transmitter.

11. A method for operating a receiver system, the method comprising:
   capturing, at an analog-to-digital converter (ADC) of the receiver system, samples $\{x(nT_S')\}$ of a received baseband signal, wherein n is a sample index, where $T_S'$ is a period of a sample clock of the ADC;
   computing at a processor of the receiver system, a reference signal $\{r(n)\}$ by operating on the baseband signal samples $\{x(nT_S')\}$ to perform carrier frequency offset (CFO) removal, carrier phase offset (CPO) removal and hard decision demodulation in order to obtain a bit stream and by remodulating the bit stream;
   computing, at the processor, an intermediate signal $\{Y(n)\}$ by operating on the baseband signal samples $\{x(nT_S')\}$ to perform CFO removal and CPO removal using the reference signal $\{r(n)\}$;
   computing, at the processor, a differential of the reference signal $\{r(n)\}$ and a differential of the intermediate signal $\{Y(n)\}$;
   computing, at the processor, an error vector signal $\{e'(n)\}$ based on the differential of the intermediate signal $\{Y(n)\}$ and the differential of the reference signal $\{r(n)\}$;
   computing, at the processor, an estimate Q for the absolute value $|\epsilon|$ of an offset parameters $\epsilon$ based on a root mean square (RMS) value of the error vector signal $\{e'(n)\}$, wherein the offset parameters $\epsilon$ represents a relative offset between the period $T_S'$ and an intended period $T_S$ of the sample clock of the ADC;
   fractionally resampling, at the processor, the baseband signal samples $\{x(nT_S')\}$ by a factor of $(1+Q)$ to obtain a first set of adjusted samples $\{Z_1(n)\}$ corresponding to sample rate $f_1=(1+Q)/T_S'$, and fractionally resampling, at the processor, the baseband signal samples $\{x(nT_S')\}$ by a factor of $(1-Q)$ to obtain a second set of adjusted samples $\{Z_2(n)\}$ corresponding to sample rate $f_2=(1-Q)/T_S'$;
   computing, at the processor, a first error vector signal $\{e_1(n)\}$ based on the first set of adjusted samples $\{Z_1(n)\}$ and the reference signal $\{r(n)\}$, and computing, at the processor, a second error vector signal $\{e_2(n)\}$ based on the second set of adjusted samples $\{Z_2(n)\}$ and the reference signal $\{r(n)\}$; and
   selecting, at the processor, either Q or –Q as an estimate for the offset parameter $\epsilon$, wherein said selecting of either Q or –Q is based on whether or not an RMS value $R_1$ of the first error vector signal is smaller than an RMS value $R_2$ of the second error vector signal.

12. The method of claim 11, further comprising:
   outputting, at the processor, either a value $1/((1+Q)T_S)$ or a value $1/((1-Q)T_S)$ as an estimate of a frequency $1/T_S'$ of the sample clock of the ADC based on whether or not the RMS value $R_1$ of the first error vector signal is smaller than the RMS value $R_2$ of the second error vector signal.

13. The method of claim 11, further comprising:
   selecting, at the processor, either the first set of adjusted samples $\{Z_1(n)\}$ or the second set of adjusted samples $\{Z_2(n)\}$ for output based on whether or not the RMS value $R_1$ of the first error vector signal is smaller than the RMS value $R_2$ of the second error vector signal, wherein the selected set of adjusted samples represents a resampling of the samples $\{x(nT_S')\}$ to a sample rate $1/T_S$.

14. The method of claim 13, further comprising:
   demodulating the selected set of adjusted samples to recover information bits;
   generating an output signal based on the information bits; and
   providing the output signal to an output device.

15. The method of claim 11, wherein the received baseband signal is a noise-perturbed version of a transmitted baseband signal generated by a transmitter, wherein the method further comprises:
   selecting, at the processor, a smaller one of the values $R_1$ and $R_2$, wherein the smaller value represents a measure of quality of the transmitter.

16. A non-transitory computer readable memory medium for operating a receiver system, wherein the memory medium stores program instructions, wherein the program instructions, when executed by a processor, cause the processor to perform a method comprising:
   directing an analog-to-digital converter (ADC) to capture samples $\{x(nT_S')\}$ of a received baseband signal, wherein n is a sample index, where $T_S'$ is a period of a sample clock of the ADC;
   computing a reference signal $\{r(n)\}$ by operating on the baseband signal samples $\{x(nT_S')\}$ to perform carrier frequency offset (CFO) removal, carrier phase offset (CPO) removal and hard decision demodulation in order to obtain a bit stream and by remodulating the bit stream;
   computing an intermediate signal $\{Y(n)\}$ by operating on the baseband signal samples $\{x(nT_S')\}$ to perform CFO removal and CPO removal using the reference signal $\{r(n)\}$;
   computing a differential of the reference signal $\{r(n)\}$ and a differential of the intermediate signal $\{Y(n)\}$;
   computing an error vector signal $\{e'(n)\}$ based on the differential of the intermediate signal $\{Y(n)\}$ and the differential of the reference signal $\{r(n)\}$;
   computing an estimate Q for the absolute value $|\epsilon|$ of an offset parameters based on a root mean square (RMS) value of the error vector signal $\{e'(n)\}$, wherein the offset parameters $\epsilon$ represents a relative offset between the period $T_S'$ and an intended period $T_S$ of the sample clock of the ADC;
   fractionally resampling the baseband signal samples $\{x(nT_S')\}$ by a factor of $(1+Q)$ to obtain a first set of adjusted samples $\{Z_1(n)\}$ corresponding to sample rate $f_1=(1+Q)/T_S'$, and fractionally resampling the baseband signal samples $\{x(nT_S')\}$ by a factor of $(1-Q)$ to obtain a second set of adjusted samples $\{Z_2(n)\}$ corresponding to sample rate $f_2=(1-Q)/T_S'$;
   computing a first error vector signal $\{e_1(n)\}$ based on the first set of adjusted samples $\{Z_1(n)\}$ and the reference signal $\{r(n)\}$, and computing a second error vector signal $\{e_2(n)\}$ based on the second set of adjusted samples $\{Z_2(n)\}$ and the reference signal $\{r(n)\}$; and
   selecting either Q or –Q as an estimate for the offset parameter s, wherein said selecting of either Q or –Q is based on whether or not an RMS value $R_1$ of the first error vector signal is smaller than an RMS value $R_2$ of the second error vector signal.

17. The memory medium of claim 16, wherein the method further comprises:
outputting either a value $1/((1+Q)T_S)$ or a value $1/((1-Q)T_S)$ as an estimate of a frequency $1/T_S'$ of the sample clock of the ADC based on whether or not the RMS value $R_1$ of the first error vector signal is smaller than the RMS value $R_2$ of the second error vector signal.

18. The memory medium of claim 16, wherein the method further comprises:
selecting either the first set of adjusted samples $\{Z_1(n)\}$ or the second set of adjusted samples $\{Z_2(n)\}$ for output based on whether or not the RMS value $R_1$ of the first error vector signal is smaller than the RMS value $R_2$ of the second error vector signal, wherein the selected set of adjusted samples represents a resampling of the samples $\{x(nT_S')\}$ to a sample rate $1/T_S$.

19. The memory medium of claim 18, wherein the method further comprises:
demodulating the selected set of adjusted samples to recover information bits;
generating an output signal based on the information bits; and
providing the output signal to an output device.

20. The memory medium of claim 16, wherein the received baseband signal is a noise-perturbed version of a transmitted baseband signal generated by a transmitter, wherein the method further comprises:
selecting a smaller one of the values $R_1$ and $R_2$, wherein the smaller value represents a measure of quality of the transmitter.

* * * * *

UNITED STATES PATENT AND TRADEMARK OFFICE
CERTIFICATE OF CORRECTION

PATENT NO. : 8,442,161 B2  
APPLICATION NO. : 13/027885  
DATED : May 14, 2013  
INVENTOR(S) : Ahmed et al.

Page 1 of 1

It is certified that error appears in the above-identified patent and that said Letters Patent is hereby corrected as shown below:

In the Claims:

Claim 6, Column 24, Line 30, please delete "parameters" and substitute -- parameter $\varepsilon$ --.

Claim 7, Column 24, Line 54, please delete "1/((1- -Q)T$_S$)" and substitute -- 1/((1-Q)T$_S$) --.

Claim 11, Column 25, Line 22, please delete "computing at a processor" and substitute -- computing, at a processor --.

Claim 11, Column 25, Line 42, please delete "parameters $\varepsilon$" and substitute -- parameter $\varepsilon$ --.

Claim 16, Column 26, Line 49, please delete "parameters" and substitute -- parameter $\varepsilon$ --.

Claim 16, Column 26, Line 67, please delete "parameter s" and substitute -- parameter $\varepsilon$ --.

Signed and Sealed this  
Sixth Day of August, 2013

Teresa Stanek Rea  
*Acting Director of the United States Patent and Trademark Office*